US012677564B2

(12) United States Patent
Zeng et al.

(10) Patent No.: US 12,677,564 B2
(45) Date of Patent: Jul. 7, 2026

(54) COLOR CONVERSION SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Cheng Zeng, Beijing (CN); Jaeho Lee, Beijing (CN); Dongyu Gao, Beijing (CN); Jinglu Bai, Beijing (CN); Kening Zheng, Beijing (CN); Han Wu, Beijing (CN); Zhen Hu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 532 days.

(21) Appl. No.: 18/255,899

(22) PCT Filed: Sep. 28, 2022

(86) PCT No.: PCT/CN2022/122118
§ 371 (c)(1),
(2) Date: Jun. 5, 2023

(87) PCT Pub. No.: WO2024/065273
PCT Pub. Date: Apr. 4, 2024

(65) Prior Publication Data
US 2024/0373715 A1      Nov. 7, 2024

(51) Int. Cl.
| | |
|---|---|
| *H10K 59/38* | (2023.01) |
| *H10K 59/122* | (2023.01) |
| *H10K 59/80* | (2023.01) |
| *H10K 102/00* | (2023.01) |

(52) U.S. Cl.
CPC ........... *H10K 59/38* (2023.02); *H10K 59/122* (2023.02); *H10K 59/877* (2023.02);
(Continued)

(58) Field of Classification Search
CPC ..... H01K 59/32; H01K 59/122; H01K 59/877
See application file for complete search history.

(56) References Cited

U.S. PATENT DOCUMENTS

| | | |
|---|---|---|
| 10,545,378 B2 | 1/2020 | Suzuki et al. |
| 10,770,524 B2 | 9/2020 | Lee et al. |

(Continued)

FOREIGN PATENT DOCUMENTS

| | | |
|---|---|---|
| CN | 111769109 A | 10/2020 |
| CN | 112466908 A | 3/2021 |

(Continued)

OTHER PUBLICATIONS

Extended European Search Report in the European Patent Application No. 22959920.4, dated Jan. 28, 2025.
International Search Report & Written Opinion mailed Feb. 22, 2023, regarding PCT/CN2022/122118.

*Primary Examiner* — Joseph L Williams
(74) *Attorney, Agent, or Firm* — Intellectual Valley Law, P.C.

(57) ABSTRACT

A color conversion substrate is provided. The color conversion substrate includes a first light scattering layer on a base substrate; a bank layer on a base substrate; a plurality of first apertures and a plurality of second apertures extending through the bank layer; a color conversion layer at least partially in the plurality of first apertures; and a second light scattering layer at least partially in the plurality of second apertures. The color conversion substrate has a first light transmissive region, a second light transmissive region, a third light transmissive region, and a light non-transmissive region. The first light scattering layer is at least partially in
(Continued)

the third light transmissive region. The second light scattering layer is in the third light transmissive region. In the third light transmissive region, the first light scattering layer and the second light scattering layer are parts of a stacked structure.

20 Claims, 15 Drawing Sheets

(52) U.S. Cl.
CPC ..... *H10K 59/879* (2023.02); *H10K 2102/331* (2023.02); *H10K 2102/351* (2023.02)

(56) References Cited

U.S. PATENT DOCUMENTS

| | | | |
|---|---|---|---|
| 2012/0098414 A1 | 4/2012 | Nakamura | |
| 2016/0195773 A1* | 7/2016 | Lee .................. | G02F 1/133617 |
| | | | 349/110 |
| 2021/0074770 A1 | 3/2021 | Choe | |
| 2021/0184160 A1 | 6/2021 | Li | |
| 2021/0359011 A1 | 11/2021 | Lee | |
| 2021/0399068 A1 | 12/2021 | Kim et al. | |
| 2022/0037623 A1 | 2/2022 | Park et al. | |
| 2022/0052118 A1 | 2/2022 | Kim et al. | |
| 2023/0209962 A1 | 6/2023 | Seong et al. | |
| 2024/0324385 A1* | 9/2024 | Park .................. | H10K 59/8792 |

FOREIGN PATENT DOCUMENTS

| | | |
|---|---|---|
| CN | 113675244 A | 11/2021 |
| KR | 20210153191 A | 12/2021 |
| KR | 20220046043 A | 4/2022 |

\* cited by examiner

| CD |
|:--:|
| ETL |
| EML1 |
| HTL |
| AD |

FIG. 6A

| CD |
|:--:|
| ETL |
| EML2 |
| CGL1 |
| EML1 |
| HTL |
| AD |

FIG. 6B

| CD |
|:--:|
| ETL |
| EML3 |
| CGL2 |
| EML2 |
| CGL1 |
| EML1 |
| HTL |
| AD |

COLOR CONVERSION SUBSTRATE AND DISPLAY APPARATUS

CROSS-REFERENCE TO RELATED APPLICATION

This application is a national stage application under 35 U.S.C. § 371 of International Application No. PCT/CN2022/122118, filed Sep. 28, 2022, the contents of which are incorporated by reference in the entirety.

TECHNICAL FIELD

The present invention relates to display technology, more particularly, to a color conversion substrate and a display apparatus.

BACKGROUND

Quantum dots material has excellent optical and electrical properties, including a narrow emission peak (with a half-peak width of approximately 30 nm), a tunable spectrum (ranging from visible light to infrared light), high photo-chemical stability, and a low starting voltage. Wavelengths of light emitted from quantum dots materials are tunable at least in part based on the particle sizes of the quantum dots. Due to these excellent properties, quantum dots have become a focus of research and development in the fields of display technology.

SUMMARY

In one aspect, the present disclosure provides a color conversion substrate, comprising a first light scattering layer on a base substrate; a bank layer on a base substrate; a plurality of first apertures and a plurality of second apertures extending through the bank layer; a color conversion layer at least partially in the plurality of first apertures; and a second light scattering layer at least partially in the plurality of second apertures; wherein the color conversion substrate comprises a first subpixel, a second subpixel, and a third subpixel; the color conversion substrate has a first light transmissive region in the first subpixel, a second light transmissive region in the second subpixel, a third light transmissive region in the third subpixel, and a light non-transmissive region; the first light scattering layer is at least partially in the third light transmissive region; the second light scattering layer is in the third light transmissive region; and in the third light transmissive region, the first light scattering layer and the second light scattering layer are parts of a stacked structure.

Optionally, the first light scattering layer is in the third light transmissive region and the light non-transmissive region, and is absent in the first light transmissive region and the second light transmissive region.

Optionally, a first thickness of the first light scattering layer is equal to or less than a second thickness of the second light scattering layer.

Optionally, a ratio of the first thickness to the second thickness is in a range of 0.2 to 1.0.

Optionally, the first light scattering layer comprises light scattering particles in a first concentration; the second light scattering layer comprises light scattering particles in a second concentration; and the first concentration is equal to or greater than the second concentration.

Optionally, a ratio of the first concentration to the second concentration is in a range of 1.0 to 2.5.

Optionally, the color conversion substrate further comprises a plurality of third apertures at least partially extending through the first light scattering layer.

Optionally, an orthographic projection of the first light scattering layer on the base substrate is at least partially non-overlapping with an orthographic projection of the plurality of first apertures on the base substrate.

Optionally, an orthographic projection of the first light scattering layer on the base substrate covers an orthographic projection of the plurality of second apertures on the base substrate.

Optionally, the color conversion layer comprises a plurality of color conversion blocks; and a respective color conversion block of the plurality of color conversion blocks is partially in a respective first aperture of the plurality of first apertures and partially in a respective third aperture of the plurality of third apertures.

Optionally, the color conversion substrate further comprises a first refractive index layer configured to prevent light transmitting from one subpixel into an adjacent subpixel through the first light scatter layer; wherein the first refractive index layer is on a side of the first light scatter layer away from the base substrate and on a side of the bank layer closer to the base substrate; and a refractive index of the first refractive index layer is greater than a refractive index of the first light scattering layer.

Optionally, an orthographic projection of the first refractive index layer on the base substrate is at least partially non-overlapping with an orthographic projection of the plurality of second apertures on the base substrate.

Optionally, an orthographic projection of the first refractive index layer on the base substrate is at least partially non-overlapping with an orthographic projection of the plurality of first apertures on the base substrate.

Optionally, an orthographic projection of the first refractive index layer on the base substrate covers an orthographic projection of the bank layer on the base substrate.

Optionally, the color conversion substrate further comprises a second refractive index layer on a side of the first refractive index layer away from the base substrate and on a side of the bank layer closer to the base substrate.

Optionally, a refractive index of the first refractive index layer is greater than a refractive index of the second refractive index layer.

Optionally, the second refractive index layer comprises a polymer matrix and hollow particles distributed in the polymer matrix.

Optionally, the color conversion substrate further comprises a third refractive index layer on a side of the second refractive index layer away from the base substrate and on a side of the bank layer closer to the base substrate; wherein a refractive index of the third refractive index layer is greater than a refractive index of the second refractive index layer.

Optionally, the refractive index of the third refractive index layer is in a range of 1.4 to 1.6; the refractive index of the second refractive index layer is in a range of 1.25 to 1.45; a refractive index of the first refractive index layer is in a range of 1.5 to 2.0; and a refractive index of the first light scattering layer is in a range of 1.5 to 1.6.

In another aspect, the present disclosure provides a display apparatus, comprising the color conversion substrate described herein or fabricated by a method described herein, and a light emitting substrate comprising a plurality of light emitting elements; wherein a respective light emitting element of the plurality of light emitting elements is configured to provide light to a respective first aperture of the plurality of first apertures or a respective second aperture of the plurality of second apertures.

BRIEF DESCRIPTION OF THE FIGURES

The following drawings are merely examples for illustrative purposes according to various disclosed embodiments and are not intended to limit the scope of the present invention.

FIG. 6A is a schematic diagram illustrating the structure of a light emitting element in some embodiments according to the present disclosure.

FIG. 6B is a schematic diagram illustrating the structure of a light emitting element in some embodiments according to the present disclosure.

FIG. 6C is a schematic diagram illustrating the structure of a light emitting element in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a color conversion substrate and a display apparatus that substantially obviate one or more of the problems due to limitations and disadvantages of the related art. In one aspect, the present disclosure provides a color conversion substrate. In some embodiments, the color conversion substrate includes a first light scattering layer on a base substrate; a bank layer on a base substrate; a plurality of first apertures and a plurality of second apertures extending through the bank layer; a color conversion layer at least partially in the plurality of first apertures; and a second light scattering layer at least partially in the plurality of second apertures.

Figure 1:
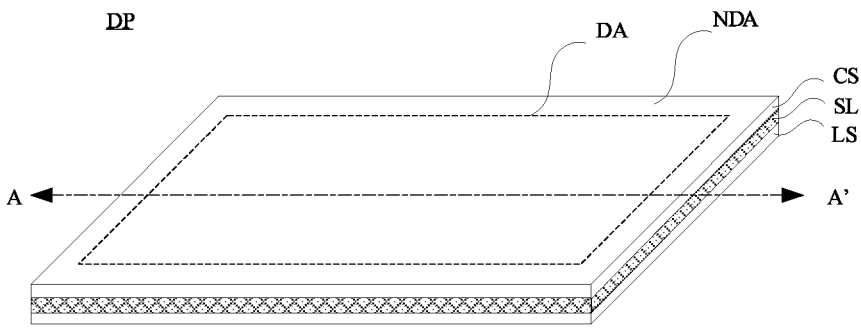
FIG. 1 is a schematic diagram illustrating the structure of a display panel in some embodiments according to the present disclosure.
Figure 2:
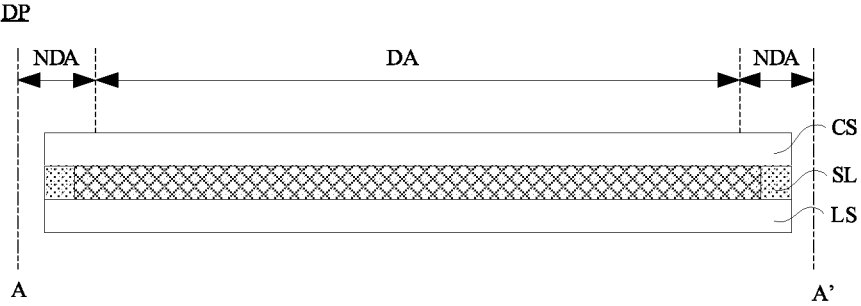
FIG. 2 is a cross-sectional view along an A-A' line in FIG. 1.

FIG. 1 is a schematic diagram illustrating the structure of a display panel in some embodiments according to the present disclosure. FIG. 2 is a cross-sectional view along an A-A' line in FIG. 1. Referring to FIG. 1 and FIG. 2, the display panel DP in some embodiments includes a light emitting substrate LS, a color conversion substrate CS, and a spacer layer SL spacing apart the light emitting substrate LS and the color conversion substrate CS. The display panel DP includes a display area DA and a non-display area NDA.

Figure 3:
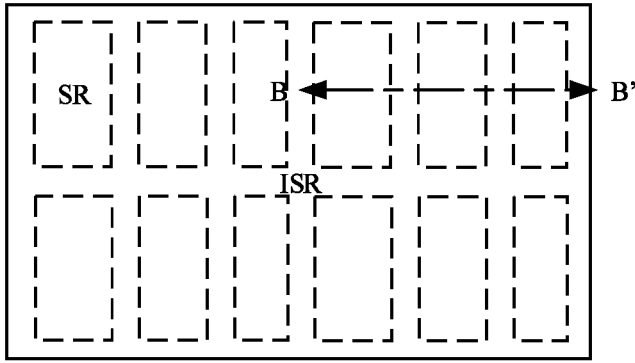
FIG. 3 is a plan view of a display panel in some embodiments according to the present disclosure.

FIG. 3 is a plan view of a display panel in some embodiments according to the present disclosure. Referring to FIG. 3, the display panel in some embodiments includes a plurality of subpixel region SR and an inter-subpixel region ISR. As used herein, a subpixel region refers to a light emission region of a subpixel, such as a region corresponding to a pixel electrode in a liquid crystal display, or a region corresponding to a light emissive layer in a light emitting diode display panel, or a region corresponding to a color conversion block in a display panel according to the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display, or a region corresponding a pixel definition layer in a light emitting diode display panel, or a region corresponding to a bank layer in a display panel according to the present disclosure. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Various appropriate implementations may be practiced to make a display panel of the present disclosure. In one example, a light emitting substrate and a color conversion substrate are fabricated respectively, and then assembled together using a filler layer into a display panel. In another example, the color conversion substrate is directly fabricated on the light emitting substrate.

Figure 4:
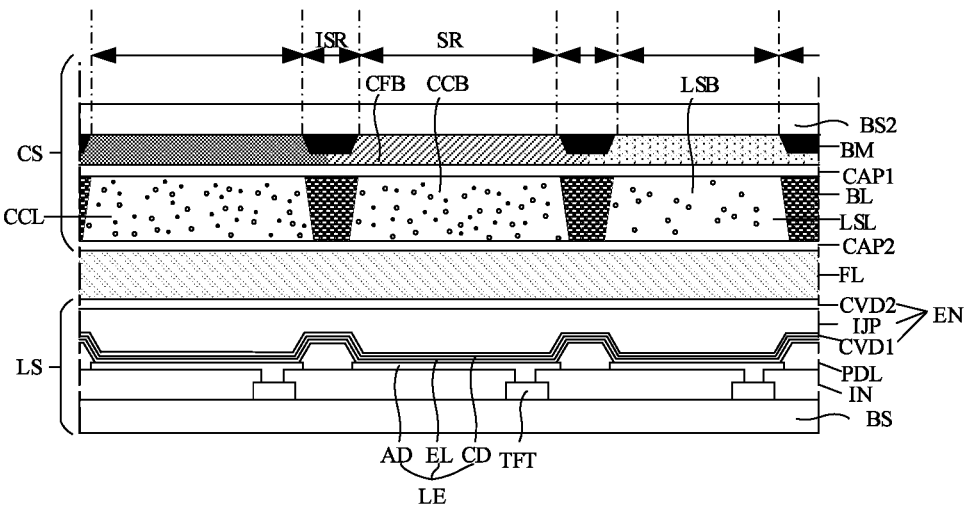
FIG. 4 is a cross-sectional view of a display panel in some embodiments according to the present disclosure.

FIG. 4 is a cross-sectional view of a display panel in some embodiments according to the present disclosure. Referring to FIG. 4, the display panel in some embodiments includes a light emitting substrate LS and a color conversion substrate CS. The light emitting substrate LS and the color conversion substrate CS are assembled together. In some embodiments, the display panel further includes a filler layer FL between the light emitting substrate LS and the color conversion substrate CS, assembling the light emitting substrate LS and the color conversion substrate CS into the display panel.

Figure 5:
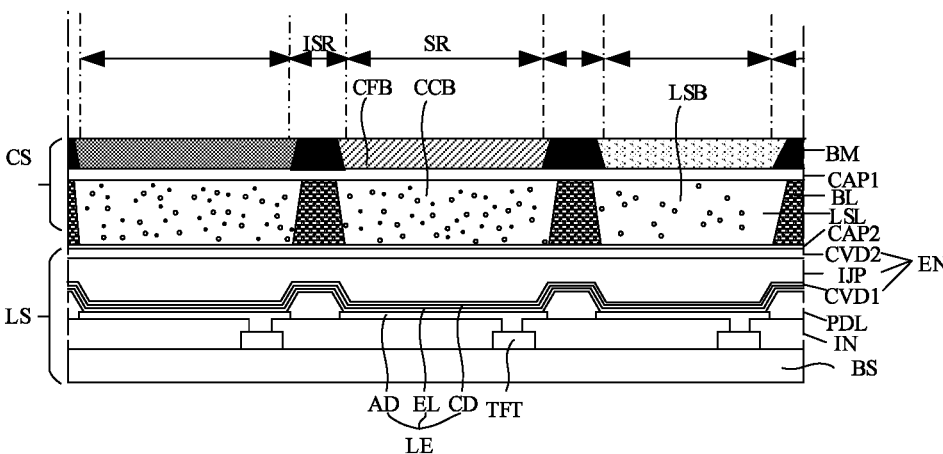
FIG. 5 is a cross-sectional view of a display panel in some embodiments according to the present disclosure.

FIG. 5 is a cross-sectional view of a display panel in some embodiments according to the present disclosure. Referring to FIG. 5, the display panel is absent of a filler layer. The color conversion substrate CS is directly on the light emitting substrate LS, for example, directly on a surface of a second inorganic encapsulating sublayer CVD2 of the light emitting substrate LS.

Referring to FIG. 4 and FIG. 5, in some embodiments, the light emitting substrate LS includes a first base substrate BS1; a plurality of thin film transistor TFT (e.g., transistors in pixel driving circuits) on the first base substrate BS1; an insulating layer IN on a side of the plurality of transistor TFT away from the first base substrate BS1; a pixel definition layer PDL and a plurality of light emitting elements LE on a side of the insulating layer IN away from the first base substrate BS1; and an encapsulating layer EN on a side of the plurality of light emitting elements LE and the pixel definition layer PDL away from the first base substrate BS1. A respective light emitting element of the plurality of light emitting elements LE includes an anode AD, a light emitting layer EL on a side of the anode AD away from the first base substrate BS1, and a cathode CD on a side of the light emitting layer EL away from the first base substrate BS1. In one example, the encapsulating layer EN include a first inorganic encapsulating sublayer CVD1, an organic encapsulating sublayer IJP on a side of the first inorganic encapsulating sublayer CVD1 away from the first base substrate BS1, and a second inorganic encapsulating sublayer CVD2 on a side of the organic encapsulating sublayer IJP away from the first base substrate BS1.

Referring to FIG. 4 and FIG. 5, in some embodiments, the color conversion substrate CS includes a bank layer BL defining a plurality of apertures, a color conversion layer CCL and a light scattering layer LSL at least partially in the plurality of apertures defined by the bank layer BL. The color conversion layer CCL includes a plurality of color conversion blocks CCB. The light scattering layer LSL includes a plurality of light scattering blocks LSB. The color conversion substrate CS in some embodiments further includes a color filter CF on the color conversion layer CCL and the light scattering layer LSL. The color filter CF includes a plurality of color filter blocks CFB. An orthographic projection of a respective color filter block of the plurality of color filter blocks CFB on a base substrate at least partially overlaps with an orthographic projection of a respective color conversion block or a respective light scattering block on the base substrate. Orthographic projections of adjacent color filter blocks may partially overlap with each other, e.g., along the edges. The color conversion substrate CS in some embodiments further includes a black matrix BM on a side of the color filter CF away from the color conversion layer CCL and the light scattering layer LSL. The black matrix BM is in the inter-subpixel region ISR. A respective color filter block, a respective color conversion block, or a respective light scattering block is at least partially in an individual subpixel region. Optionally, the color conversion substrate CS includes a first cap layer CAP1 on a side of the color filter CF closer to the bank layer BL, the color conversion layer CCL, and the light scattering layer LSL. The color conversion substrate CS optionally includes a second cap layer CAP2 on a side of the bank layer BL, the color conversion layer CCL, and the light scattering layer LSL away from the color filter CF.

In some embodiments, the display panel is a quantum dots display panel. In a quantum dots display panel, a light source (e.g., a blue light source) is used to excite quantum dots to emit light based on the photoluminescence excitation principle. In some embodiments, the plurality of color conversion blocks CCB include a first color conversion block and a second color conversion block. In one example, the first color conversion block is configured to convert a light of a third color (e.g., a blue light) into a light of a first color (e.g., a red light). In another example, the second color conversion block is configured to convert the light of the third color (e.g., a blue light) into a light of a second color (e.g., a green light). The plurality of light scattering blocks LSB do not convert a color of the incident light. Optionally, the plurality of light scattering blocks LSB are configured to scatter the incident light (e.g., a blue light), which emits through a color filter block for image display. The plurality of color filter blocks CFB includes a color filter block of a first color (e.g., a red color filter block) corresponding to the first color conversion block, a color filter block of a second color (e.g., a green color filter block) corresponding to the second color conversion block, and a color filter block of a third color (e.g., a blue color filter block) corresponding to a light scattering block.

Figures 6A, 6B, 6C:
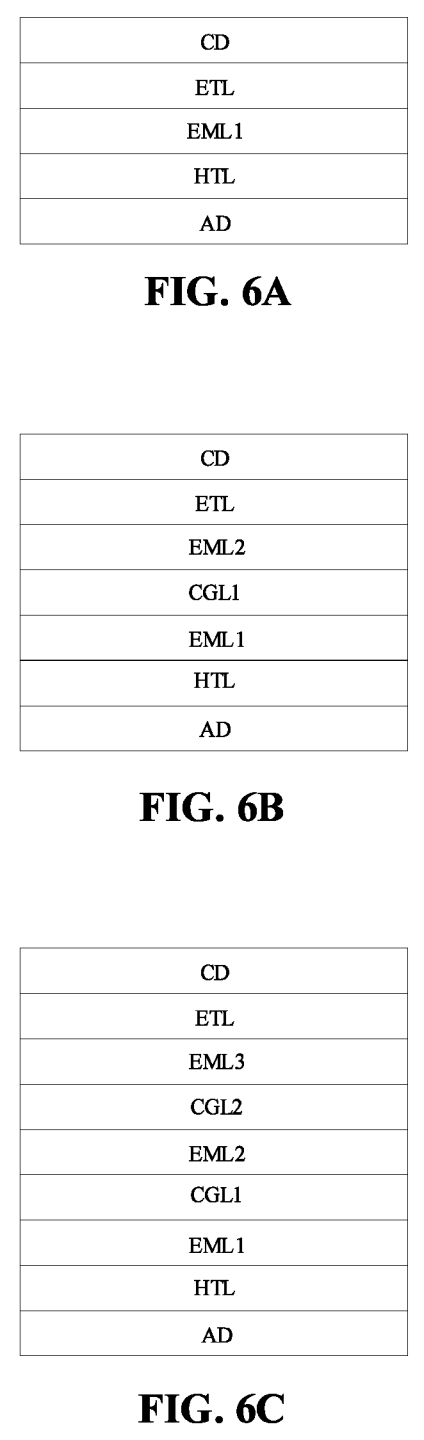

Various appropriate light emitting elements may be implemented in the display panel according to the present disclosure. FIG. 6A is a schematic diagram illustrating the structure of a light emitting element in some embodiments according to the present disclosure. Referring to FIG. 6A, the light emitting element in some embodiments includes an anode AD, a hole transport layer HTL on the anode AD, a first light emitting layer EML1 on a side of the hole transport layer HTL away from the anode AD, an electron transport layer ETL on a side of the first light emitting layer EML1 away from the hole transport layer HTL, and a cathode CD on a side of the electron transport layer ETL away from the first light emitting layer EML1.

In some embodiments, the light emitting element may have a stacked structure. FIG. 6B is a schematic diagram illustrating the structure of a light emitting element in some embodiments according to the present disclosure. Referring to FIG. 6B, the light emitting element in some embodiments includes an anode AD, a hole transport layer HTL on the anode AD, a first light emitting layer EML1 on a side of the hole transport layer HTL away from the anode AD, a first charge generation layer CGL1 on a side of the first light emitting layer EML1 away from the hole transport layer HTL, a second light emitting layer EML2 on a side of the first charge generation layer CGL1 away from the first light emitting layer EML1, an electron transport layer ETL on a side of the second light emitting layer EML2 away from the first charge generation layer CGL1, and a cathode CD on a side of the electron transport layer ETL away from the second light emitting layer EML2.

FIG. 6C is a schematic diagram illustrating the structure of a light emitting element in some embodiments according to the present disclosure. Referring to FIG. 6C, the light emitting element in some embodiments includes an anode AD, a hole transport layer HTL on the anode AD, a first light emitting layer EML1 on a side of the hole transport layer HTL away from the anode AD, a first charge generation layer CGL1 on a side of the first light emitting layer EML1 away from the hole transport layer HTL, a second light emitting layer EML2 on a side of the first charge generation layer CGL1 away from the first light emitting layer EML1, a second charge generation layer CGL2 on a side of the second light emitting layer EML2 away from the first charge generation layer CGL1, a third light emitting layer EML3 on a side of the second charge generation layer CGL2 away from the second light emitting layer EML2, an electron transport layer ETL on a side of the third light emitting layer EML3 away from the second charge generation layer CGL2, and a cathode CD on a side of the electron transport layer ETL away from the second light emitting layer EML3.

Figure 7A:
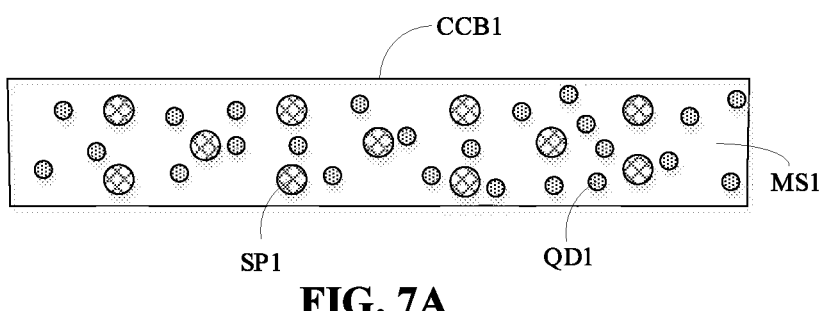
FIG. 7A is a schematic diagram illustrating the structure of a first color conversion block in some embodiments according to the present disclosure.

FIG. 7A is a schematic diagram illustrating the structure of a first color conversion block in some embodiments according to the present disclosure. Referring to FIG. 7A, the first color conversion block CCB1 is a color conversion block configured to convert a light of a third color (e.g., a blue light) into a light of a first color (e.g., a red light). In some embodiments, the first color conversion block CCB1 includes a first matrix MS1, a plurality of first scattering particles SP1 and a plurality of first quantum dots QD1 dispersed in the first matrix MS1. The first matrix MS1 may include a polymer material such as an organic polymer material. Examples of appropriate polymer materials for making the first matrix MS1 include epoxy resins, acrylic resins, polyurethane resins, silicone resins, and silane resins. Examples of appropriate materials for making the plurality of first scattering particles SP1 include $TiO_2$, $ZnO$, $ZrO_2$, $Al_2O_3$, $SiO_2$. Examples of appropriate quantum dots materials for making the plurality of first quantum dots QD1 include a quantum dots material of a first color (e.g., a red color). The quantum dots material may include a material selected from a group consisting of CdS, CdSe, ZnSe, InP, PbS, CsPbCl3, CsPbBr3, CsPhI3, CdS/ZnS, CdSe/ZnS, InP/ZnS, PbS/ZnS, CsPbCl3/ZnS, CsPbBr3/ZnS, and CsPhI3/ZnS.

Figure 7B:
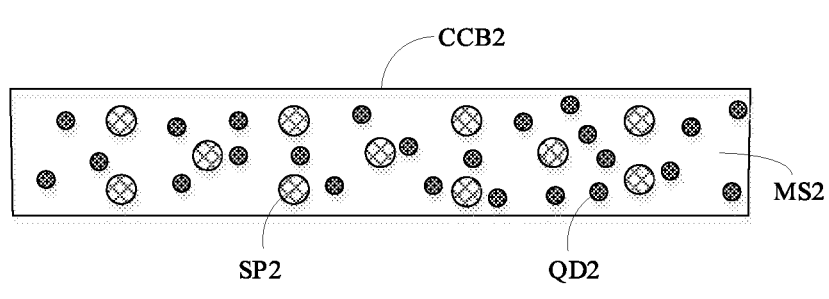
FIG. 7B is a schematic diagram illustrating the structure of a second color conversion block in some embodiments according to the present disclosure.

FIG. 7B is a schematic diagram illustrating the structure of a second color conversion block in some embodiments according to the present disclosure. Referring to FIG. 7B, the second color conversion block CCB2 is a color conversion block configured to convert a light of a third color (e.g., a blue light) into a light of a second color (e.g., a green light). In some embodiments, the second color conversion block CCB2 includes a second matrix MS2, a plurality of second scattering particles SP2 and a plurality of second quantum dots QD2 dispersed in the second matrix MS2. The second matrix MS2 may include a polymer material such as an organic polymer material. Examples of appropriate polymer materials for making the second matrix MS2 include epoxy resins, acrylic resins, polyurethane resins, silicone resins, and silane resins. Examples of appropriate materials for making the plurality of second scattering particles SP2 include $TiO_2$, $ZnO$, $ZrO_2$, $Al_2O_3$, $SiO_2$. Examples of appropriate quantum dots materials for making the plurality of second quantum dots QD2 include a quantum dots material of a second color (e.g., a green color). The quantum dots material may include a material selected from a group consisting of CdS, CdSe, ZnSe, InP, PbS, CsPbCl3, CsPbBr3, CsPhI3, CdS/ZnS, CdSe/ZnS, InP/ZnS, PbS/ZnS, CsPbCl3/ZnS, CsPbBr3/ZnS, and CsPhI3/ZnS.

Figure 7C:
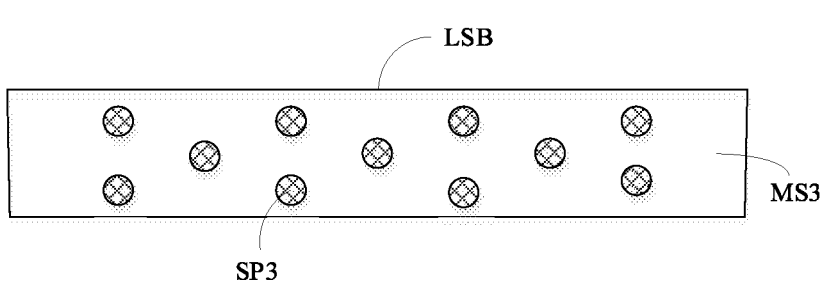
FIG. 7C is a schematic diagram illustrating the structure of a light scattering block in some embodiments according to the present disclosure.

FIG. 7C is a schematic diagram illustrating the structure of a light scattering block in some embodiments according to the present disclosure. Referring to FIG. 7C, the light scattering block LSB in some embodiments includes a third matrix MS3 and a plurality of third scattering particles SP3 dispersed in the third matrix MS3. The third matrix MS3 may include a polymer material such as an organic polymer material. Examples of appropriate polymer materials for making the third matrix MS3 include epoxy resins, acrylic resins, polyurethane resins, silicone resins, and silane resins. Examples of appropriate materials for making the plurality of third scattering particles SP3 include $TiO_2$, $ZnO$, $ZrO_2$, $Al_2O_3$, $SiO_2$.

In one example, the first matrix MS1, the second matrix MS2, and the third matrix MS3 includes a same polymer material. In another example, at least two of the first matrix MS1, the second matrix MS2, and the third matrix MS3 includes different polymer materials.

In one example, the first scattering particles SP1, the second scattering particles SP2, and the third scattering particles SP3 includes a same scattering material. In another example, at least two of the first scattering particles SP1, the second scattering particles SP2, and the third scattering particles SP3 includes different scattering materials.

Figure 8:
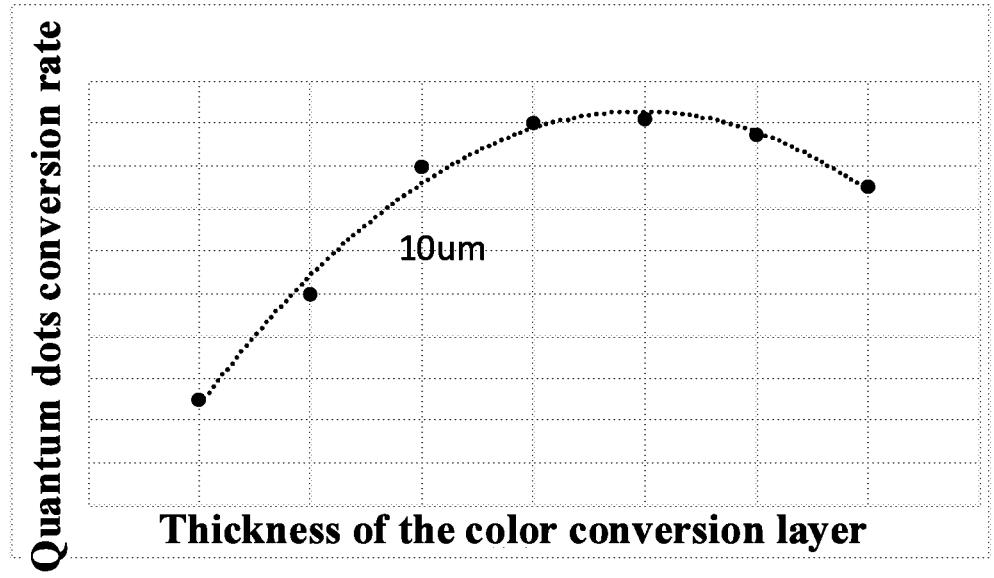
FIG. 8 illustrates a correlation between a thickness of the color conversion layer and a quantum dots conversion rate in some embodiments according to the present disclosure.

FIG. 8 illustrates a correlation between a thickness of the color conversion layer and a quantum dots conversion rate in some embodiments according to the present disclosure. The inventors of the present disclosure discover that the quantum dots conversion rate is correlated to the thickness of the color conversion layer. In general, the quantum dots conversion rate increases with the thickness of the color conversion layer. Due to the limitations by the material used in fabricating the color conversion layer, the maximum thickness of the color conversion layer in related color conversion substrate is typically only approximately 10 μm, less than the optimal thickness value for achieving the maximum quantum dots conversion rate.

The inventors of the present disclosure discover that, surprisingly and unexpectedly, the intricate structure of the color conversion substrate significantly improves the quantum dots conversion rate, greatly improving light emission efficiency of a display panel having the color conversion substrate according to the present disclosure.

Figure 9A:
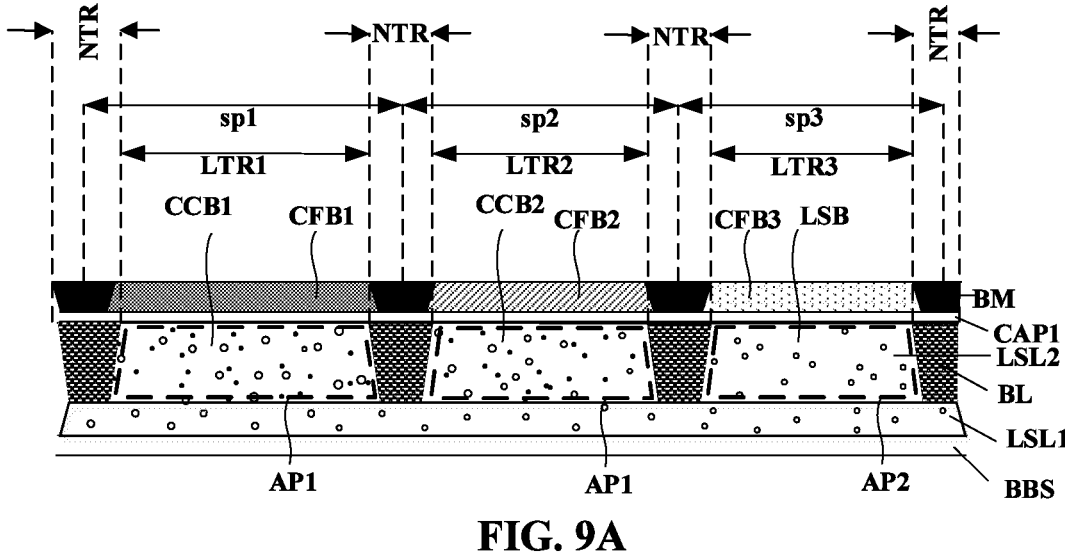
FIG. 9A is a schematic diagram illustrating the structure of a color conversion substrate in some embodiments according to the present disclosure.

FIG. 9A is a schematic diagram illustrating the structure of a color conversion substrate in some embodiments according to the present disclosure. Referring to FIG. 9A, the color conversion substrate in some embodiments includes a first light scattering layer LSL1 on a base substrate BBS; a bank layer BL on a base substrate BBS; a plurality of first apertures AP1 and a plurality of second apertures AP2 extending through the bank layer BL; a color conversion layer CCL at least partially in the plurality of first apertures AP1; and a second light scattering layer LSL2 at least partially in the plurality of second apertures AP2.

Figure 9B:
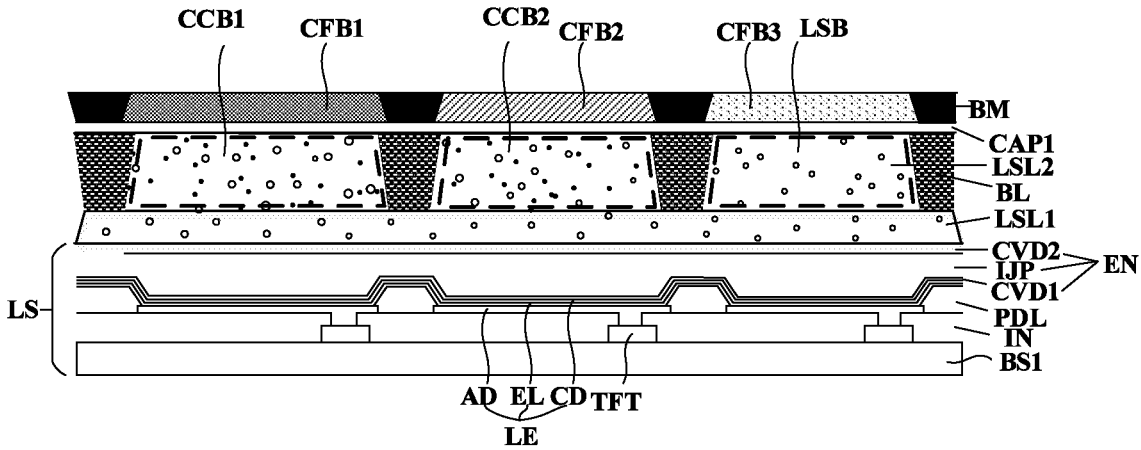
FIG. 9B is a cross-sectional view of a display panel in some embodiments according to the present disclosure.

Depending on application scenarios, various appropriate layers may be implemented as the base substrate BBS. In one example, referring to FIG. 4 or FIG. 5, the base substrate BBS in some embodiments may be a second cap layer CAP2. In another example, the base substrate BBS in some embodiments may be a second inorganic encapsulating sublayer CVD2. FIG. 9B is a cross-sectional view of a display panel in some embodiments according to the present disclosure. Referring to FIG. 9B, the first light scattering layer LSL1 is on the second encapsulating sublayer CVD2 (equivalent to the base substrate BBS in FIG. 9A). In one example, the first light scattering layer LSL1 is in direct contact with the second encapsulating sublayer CVD2.

Various appropriate light scattering materials may be used for making the first light scattering layer LSL1. In some embodiments, the first light scattering layer LSL1 in some embodiments includes a fourth matrix and a plurality of fourth scattering particles dispersed in the fourth matrix. The fourth matrix may include a polymer material such as an organic polymer material. Examples of appropriate polymer materials for making the fourth matrix include epoxy resins, acrylic resins, polyurethane resins, silicone resins, and silane resins. Examples of appropriate materials for making the plurality of fourth scattering particles include $TiO_2$, $ZnO$, $ZrO_2$, $Al_2O_3$, $SiO_2$.

Various appropriate light scattering materials may be used for making the second light scattering layer LSL2. In some embodiments, the second light scattering layer LSL2 in some embodiments includes a third matrix and a plurality of third scattering particles dispersed in the third matrix. The third matrix may include a polymer material such as an organic polymer material. Examples of appropriate polymer materials for making the third matrix include epoxy resins, acrylic resins, polyurethane resins, silicone resins, and silane resins. Examples of appropriate materials for making the plurality of third scattering particles include $TiO_2$, $ZnO$, $ZrO_2$, $Al_2O_3$, $SiO_2$.

In one example, the third matrix and the fourth matrix include a same polymer material. In another example, the third matrix and the fourth matrix include different polymer materials.

In one example, the plurality of third scattering particles and the plurality of fourth scattering particles include a same material. In another example, the plurality of third scattering particles and the plurality of fourth scattering particles include different materials.

In one example, the third matrix and the fourth matrix include a same polymer material, and the plurality of third scattering particles and the plurality of fourth scattering particles include a same material. In another example, the third matrix and the fourth matrix include different polymer materials, and the plurality of third scattering particles and the plurality of fourth scattering particles include different materials.

In one example, a concentration of the plurality of third scattering particles in the second light scattering layer LSL2 is substantially the same as a concentration of the plurality of fourth scattering particles in the first light scattering layer LSL1. In another example, a concentration of the plurality of third scattering particles in the second light scattering layer LSL2 is different from a concentration of the plurality of fourth scattering particles in the first light scattering layer LSL1. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

Figure 9C:
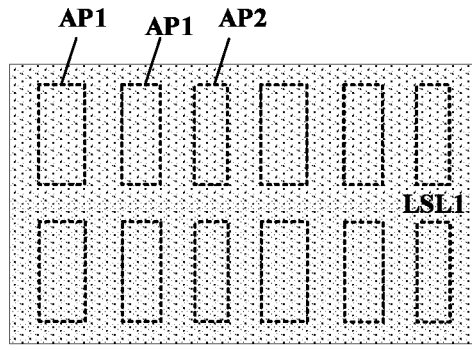
FIG. 9C is a plan view of a first light scattering layer, a plurality of first apertures, and a plurality of second apertures in some embodiments according to the present disclosure.
Figure 9D:
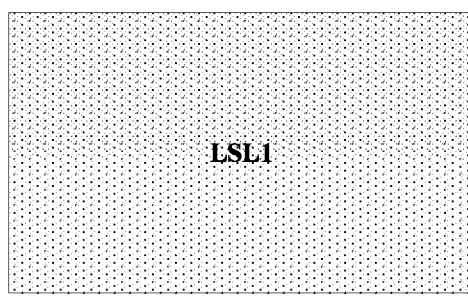
FIG. 9D is a plan view of a first light scattering layer in some embodiments according to the present disclosure.

FIG. 9C is a plan view of a first light scattering layer, a plurality of first apertures, and a plurality of second apertures in some embodiments according to the present disclosure. FIG. 9D is a plan view of a first light scattering layer in some embodiments according to the present disclosure. In the color conversion substrate depicted in FIG. 9A to FIG. 9D, the first light scattering layer LSL1 extends throughout areas corresponding to the plurality of first apertures AP1 and the plurality of second apertures AP2. Optionally, an orthographic projection of the first light scattering layer LSL1 on the base substrate BBS at least partially overlaps with orthographic projections of the plurality of first apertures AP1 on the base substrate BBS, and at least partially overlaps with orthographic projections of the plurality of second apertures AP2 on the base substrate BBS.

In some embodiments, the color conversion layer CCL includes a plurality of color conversion blocks (e.g., a first color conversion block CCB1 and a second color conversion block CCB2). Optionally, the second light scattering layer LSL2 includes a plurality of light scattering blocks LSB. Optionally, an orthographic projection of the first light scattering layer LSL1 on the base substrate BBS at least partially overlaps with orthographic projections of the plurality of color conversion blocks on the base substrate BBS, and at least partially overlaps with orthographic projections of the plurality of light scattering blocks LSB on the base substrate BBS. Optionally, the orthographic projection of the first light scattering layer LSL1 on the base substrate BBS at least partially overlaps with an orthographic projection of the first color conversion block CCB1 on the base substrate BBS, and at least partially overlaps with an orthographic projection of the second color conversion block CCB2 on the base substrate BBS.

In some embodiments, an orthographic projection of the first light scattering layer LSL1 on the base substrate BBS at least partially overlaps with an orthographic projection of the bank layer BL on the base substrate BBS.

In some embodiments, the color filter CF includes a plurality of color filter blocks (e.g., a color filter block of a first color CFB1, a color filter block of a second color CFB2, and a color filter block of a third color CFB3). Optionally, an orthographic projection of the first light scattering layer LSL1 on the base substrate BBS at least partially overlaps with orthographic projections of the plurality of color filter blocks on the base substrate BBS. Optionally, the orthographic projection of the first light scattering layer LSL1 on the base substrate BBS at least partially overlaps with an orthographic projection of the color filter block of a first color CFB1 on the base substrate BBS, at least partially overlaps with an orthographic projection of the color filter block of a second color CFB2 on the base substrate BBS, and at least partially overlaps with an orthographic projection of the color filter block of a third color CFB3 on the base substrate BBS.

In some embodiments, referring to FIG. 9A, the color conversion substrate comprises a first subpixel sp1, a second subpixel sp2, and a third subpixel sp3. As shown in FIG. 9A, the color conversion substrate has a first light transmissive region LTR1 in the first subpixel sp1, a second light transmissive region LTR2 in the second subpixel sp2, a third light transmissive region LTR3 in the third subpixel sp3, and a light non-transmissive region NTR. In some embodiments, the first light scattering layer LSL1 is at least partially in the third light transmissive region LTR3. The second light scattering layer LSL2 is in the third light transmissive region LTR3, e.g., is limited in the third light transmissive region LTR3. Optionally, in the third light transmissive region LTR3, the first light scattering layer LSL1 and the second light scattering layer LSL2 are parts of a stacked structure. In one example, in the third light transmissive region LTR3, the first light scattering layer LSL1 is in direct contact with the second light scattering layer LSL2. In the example depicted in FIG. 9A, the first light scattering layer LSL1 is not limited to the third light transmissive region LTR3. In another example, the first light scattering layer LSL1 is at least partially in the first light transmissive region LTR1, at least partially in the second light transmissive region LTR2, at least partially in the third light transmissive region LTR3, and at least partially in the light non-transmissive region NTR.

Figure 10A:
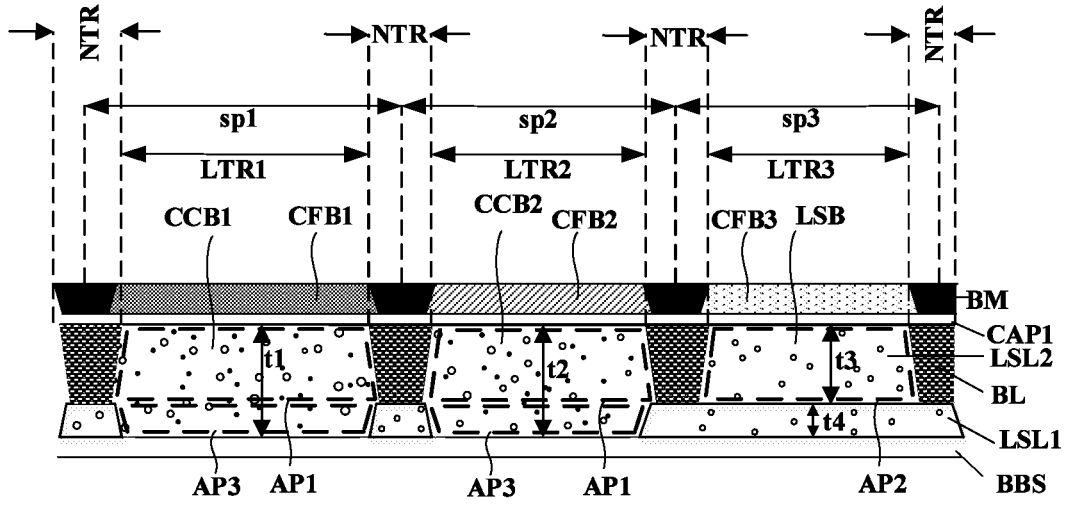
FIG. 10A is a schematic diagram illustrating the structure of a color conversion substrate in some embodiments according to the present disclosure.
Figure 10B:
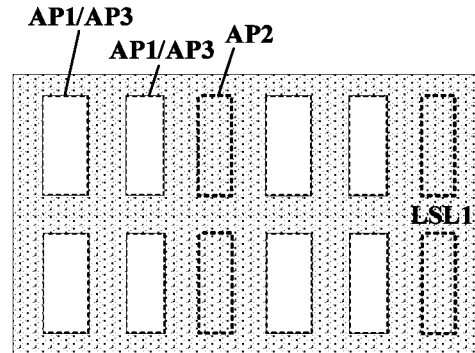
FIG. 10B is a plan view of a first light scattering layer, a plurality of first apertures, and a plurality of second apertures in some embodiments according to the present disclosure.
Figure 10C:
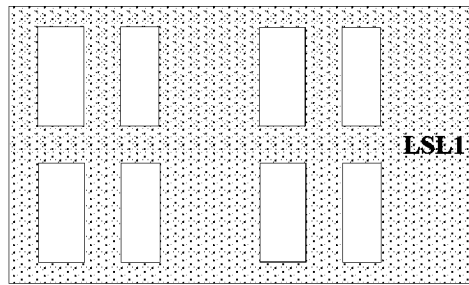
FIG. 10C is a plan view of a first light scattering layer in some embodiments according to the present disclosure.

FIG. 10A is a schematic diagram illustrating the structure of a color conversion substrate in some embodiments according to the present disclosure. FIG. 10B is a plan view of a first light scattering layer, a plurality of first apertures, and a plurality of second apertures in some embodiments according to the present disclosure. FIG. 10C is a plan view of a first light scattering layer in some embodiments according to the present disclosure. In the color conversion substrate depicted in FIG. 10A to FIG. 10C, the first light scattering layer LSL1 extends throughout areas corresponding to the plurality of second apertures AP2, but is at least partially absent in areas corresponding to the plurality of first apertures AP1. Optionally, an orthographic projection of the first light scattering layer LSL1 on the base substrate BBS at least partially overlaps with orthographic projections of the plurality of second apertures AP2 on the base substrate BBS, and is at least partially non-overlapping with orthographic projections of the plurality of first apertures AP1 on the base substrate BBS. Optionally, the orthographic projection of the first light scattering layer LSL1 on the base substrate BBS covers orthographic projections of the plurality of second apertures AP2 on the base substrate BBS.

In some embodiments, the color conversion substrate further includes a plurality of third apertures AP3 at least partially extending through the first light scattering layer LSL1. Optionally, an orthographic projection of a respective third aperture of the plurality of third apertures AP3 on the base substrate BBS at least partially overlaps with an orthographic projection of a respective first aperture of the plurality of first apertures AP1 on the base substrate BBS, and is non-overlapping with an orthographic projection of a respective second aperture of the plurality of second apertures AP2 on the base substrate BBS.

In some embodiments, the color conversion layer CCL includes a plurality of color conversion blocks (e.g., a first color conversion block CCB1 and a second color conversion block CCB2). Optionally, the second light scattering layer LSL2 includes a plurality of light scattering blocks LSB. Optionally, an orthographic projection of the first light scattering layer LSL1 on the base substrate BBS is at least partially non-overlapping with orthographic projections of the plurality of color conversion blocks on the base substrate BBS, and at least partially overlaps with orthographic projections of the plurality of light scattering blocks LSB on the base substrate BBS. Optionally, the orthographic projection of the first light scattering layer LSL1 on the base substrate BBS is at least partially non-overlapping with an orthographic projection of the first color conversion block CCB1 on the base substrate BBS, and is at least partially non-overlapping with an orthographic projection of the second color conversion block CCB2 on the base substrate BBS.

In some embodiments, a respective color conversion block of the plurality of color conversion blocks is partially in a respective first aperture of the plurality of first apertures AP1 and partially in a respective third aperture of the plurality of third apertures AP3. For example, the first color conversion block CCB1 is partially in the respective first aperture of the plurality of first apertures AP1 and partially in the respective third aperture of the plurality of third apertures AP3. In another example, the second color conversion block CCB2 is partially in the respective first aperture of the plurality of first apertures AP1 and partially in the respective third aperture of the plurality of third apertures AP3.

In some embodiments, an orthographic projection of the first light scattering layer LSL1 on the base substrate BBS at least partially overlaps with an orthographic projection of the bank layer BL on the base substrate BBS.

In some embodiments, the color filter CF includes a plurality of color filter blocks (e.g., a color filter block of a first color CFB1, a color filter block of a second color CFB2, and a color filter block of a third color CFB3). Optionally, an orthographic projection of the first light scattering layer LSL1 on the base substrate BBS is at least partially non-overlapping with an orthographic projection of the color filter block of a first color CFB1 on the base substrate BBS, is at least partially non-overlapping with an orthographic projection of the color filter block of a second color CFB2 on the base substrate BBS, and at least partially overlaps with an orthographic projection of the color filter block of a third color CFB3 on the base substrate BBS.

In some embodiments, the first color conversion block CCB1 has a thickness t1, the second color conversion block CCB2 has a thickness t2, and a respective light scattering block of the plurality of light scattering blocks LSB has a thickness t3. Optionally, the thickness t1 is greater than the thickness t3. Optionally, the thickness t2 is greater than the thickness t3. By having the first light scattering layer LSL1 at least partially absent in areas corresponding to the plurality of first apertures AP1, the first color conversion block CCB1 (e.g., a red color conversion block) and the second color conversion block CCB2 (e.g., a green color conversion block) may have increased thicknesses, effectively enhancing light conversion efficiency in the color conversion layer CCL.

The inventors of the present disclosure discover that, by having the first light scattering layer LSL1 present in areas corresponding to the plurality of second apertures AP2, and by having a ratio of a concentration of the plurality of fourth scattering particles in the first light scattering layer LSL1 to a concentration of the plurality of third scattering particles in the second light scattering layer LSL2 in a certain range, a viewing angle of a subpixel (e.g., a blue subpixel) in a display panel corresponding to the plurality of second apertures AP2 can be improved significantly, thereby enhancing the display quality.

In some embodiments, the first light scattering layer LSL1 includes a photo-initiator. For example, a light scattering material having a matrix material and scattering particles is deposited on the base substrate BBS, the photo-initiator initiates polymerization of the matrix material, polymerizing the matrix material into a matrix. The light scattering material is patterned to form the first light scattering layer LSL1. Examples of photo-initiators include acetophenones, acylphosphine oxide, benzophenones and tertiary amine complexes. Optionally, the first light scattering layer LSL1 includes a photo-initiator, and the second light scattering layer LSL2 is absent of a photo-initiator.

In some embodiments, the first light scattering layer LSL1 has a thickness t4. Optionally, the thickness t1 is substantially the same as a sum of the thickness t3 and the thickness t4. Optionally, the thickness t2 is substantially the same as a sum of the thickness t3 and the thickness t4. Optionally, the thickness t1 is substantially the same as the thickness t2. In one example, the thickness t4 is in a range of 5 μm to 10 μm.

In some embodiments, referring to FIG. 10A, an orthographic projection of a first surface of the bank layer BL on the base substrate BBS covers an orthographic projection of a second surface of the bank layer BL on the base substrate BBS, wherein the first surface is on a side of the second surface away from the base substrate BBS. In one example as depicted in FIG. 10A, in a cross-section perpendicular to a surface of the base substrate BBS and intersecting multiple adjacent color conversion blocks and/or one or more light scattering blocks (e.g., the cross-section shown in FIG.

10A), a portion of the bank layer BL between two adjacent color conversion/light scattering blocks has an inverted trapezoidal shape.

Figure 10D:
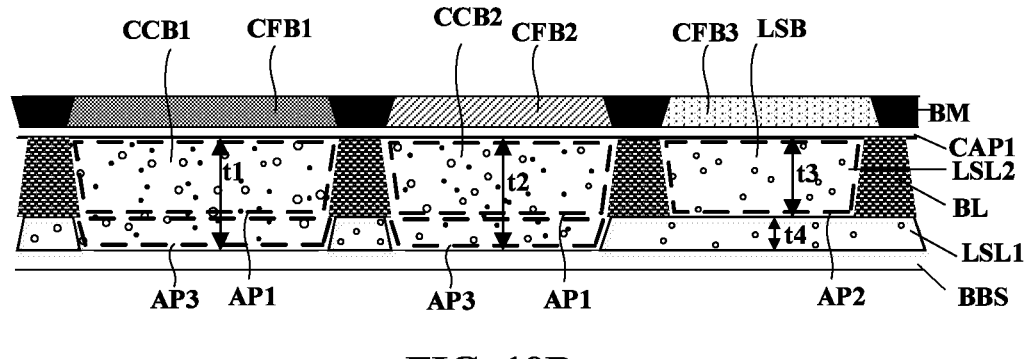
FIG. 10D is a schematic diagram illustrating the structure of a color conversion substrate in some embodiments according to the present disclosure.

FIG. 10D is a schematic diagram illustrating the structure of a color conversion substrate in some embodiments according to the present disclosure. In some embodiments, referring to FIG. 10D, an orthographic projection of a second surface of the bank layer BL on the base substrate BBS covers an orthographic projection of a first surface of the bank layer BL on the base substrate BBS, wherein the first surface is on a side of the second surface away from the base substrate BBS. In one example as depicted in FIG. 10D, in a cross-section perpendicular to a surface of the base substrate BBS and intersecting multiple adjacent color conversion blocks and/or one or more light scattering blocks (e.g., the cross-section shown in FIG. 10D), a portion of the bank layer BL between two adjacent color conversion/light scattering blocks has a trapezoidal shape.

In some embodiments, referring to FIG. 10A, the color conversion substrate comprises a first subpixel sp1, a second subpixel sp2, and a third subpixel sp3. As shown in FIG. 10A, the color conversion substrate has a first light transmissive region LTR1 in the first subpixel sp1, a second light transmissive region LTR2 in the second subpixel sp2, a third light transmissive region LTR3 in the third subpixel sp3, and a light non-transmissive region NTR. In some embodiments, the first light scattering layer LSL1 is at least partially in the third light transmissive region LTR3. The second light scattering layer LSL2 is in the third light transmissive region LTR3, e.g., is limited in the third light transmissive region LTR3. Optionally, in the third light transmissive region LTR3, the first light scattering layer LSL1 and the second light scattering layer LSL2 are parts of a stacked structure. In one example, in the third light transmissive region LTR3, the first light scattering layer LSL1 is in direct contact with the second light scattering layer LSL2. In the example depicted in FIG. 10A, the first light scattering layer LSL1 is in the third light transmissive region LTR3 and the light non-transmissive region NTR, and is absent in the first light transmissive region LTR1 and the second light transmissive region LTR2.

Figure 11A:
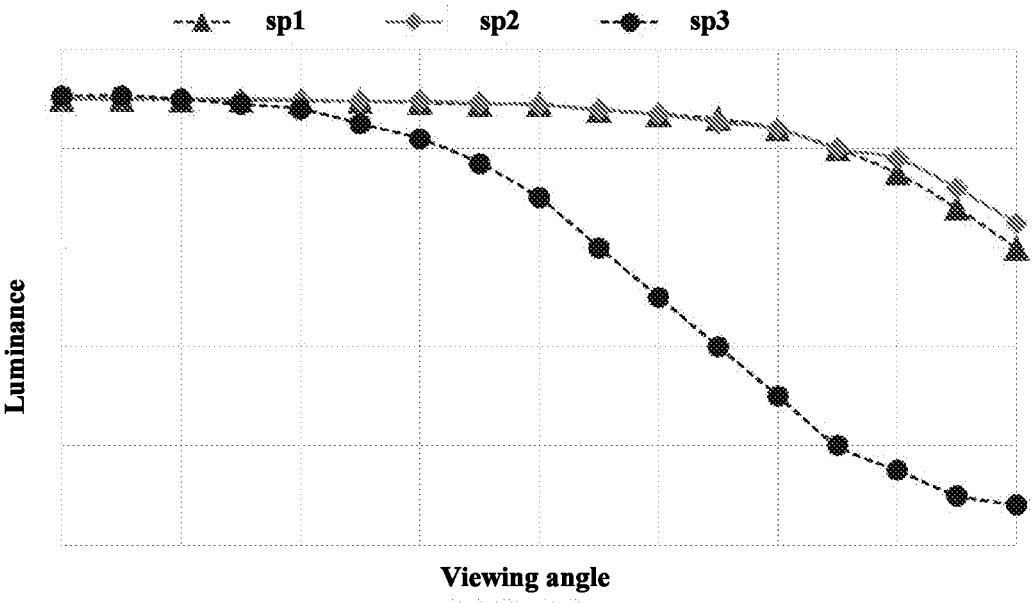
FIG. 11A shows a correlation between view angles and luminance in a related display panel having a related color conversion substrate.
Figure 11B:
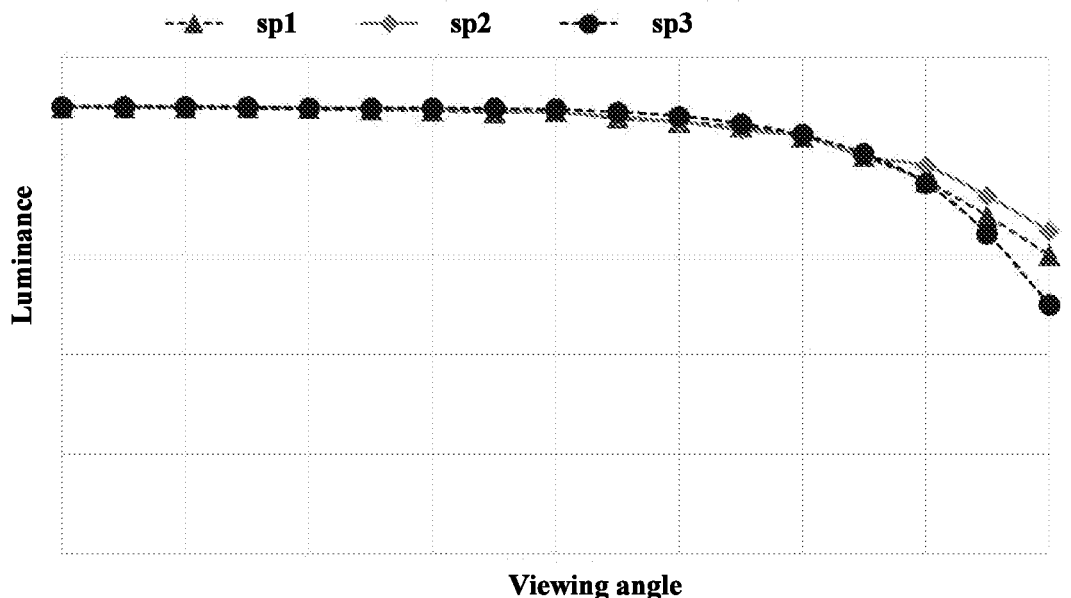
FIG. 11B shows a correlation between view angles and luminance in a display panel having a color conversion substrate in some embodiments according to the present disclosure.

FIG. 11A shows a correlation between view angles and luminance in a related display panel having a related color conversion substrate. FIG. 11B shows a correlation between view angles and luminance in a display panel having a color conversion substrate in some embodiments according to the present disclosure. Referring to FIG. 11A and FIG. 11B, a first subpixel sp1 stands for a subpixel having the first color conversion block (e.g., a red color conversion block), a second subpixel sp2 stands for a subpixel having the second color conversion block (e.g., a green color conversion block), and a third subpixel sp3 stands for a subpixel having a respective light scattering block of a plurality of light scattering blocks. In a related display panel of FIG. 11A, the display panel is absent of a first light scattering layer. In a display panel of FIG. 11B, the display panel includes a first light scattering layer, for example, the first light scattering layer LSL1 as depicted in FIG. 10A.

As shown in FIG. 11A, in the related display panel, luminance of the third subpixel sp3 (e.g., a blue subpixel) decreases rapidly as the view angle increases. The inventors of the present disclosure discover that the present color conversion substrate unexpectedly improve the luminance of the third subpixel sp3, particularly at a relatively large view angle.

The inventors of the present disclosure further discover that the issue of luminance at a large view angle can be further improved by adjusting parameters of the first light scattering layer relative to the second light scattering layer. In some embodiments, a first thickness of the first light scattering layer is equal to or less than a second thickness of the second light scattering layer. Optionally, a ratio of the first thickness to the second thickness is in a range of 0.2 to 1.0, e.g., 0.2 to 0.3, 0.3 to 0.4, 0.4 to 0.5, 0.5 to 0.6, 0.6 to 0.7, 0.7 to 0.8, 0.8 to 0.9, or 0.9 to 1.0.

In some embodiments, the first light scattering layer comprises light scattering particles in a first concentration, and the second light scattering layer comprises light scattering particles in a second concentration. Optionally, the first concentration is equal to or greater than the second concentration. Optionally, a ratio of the first concentration to the second concentration is in a range of 1.0 to 2.5, e.g., 1.0 to 1.1, 1.1 to 1.2, 1.2 to 1.3, 1.3 to 1.4, 1.4 to 1.5, 1.5 to 1.6, 1.6 to 1.7, 1.7 to 1.8, 1.8 to 1.9, 1.9 to 2.0, 2.0 to 2.1, 2.1 to 2.2, 2.2 to 2.3, 2.3 to 2.4, or 2.4 to 2.5.

The inventors of the present disclosure further discover that a synergistic effect can be achieved by adjusting thicknesses and particles concentration of the first light scattering layer and the second light scattering layer simultaneously. Accordingly, in some embodiments, the first thickness of the first light scattering layer is equal to or less than the second thickness of the second light scattering layer; and the first concentration is equal to or greater than the second concentration. Optionally, the ratio of the first thickness to the second thickness is in a range of 0.2 to 1.0; and the ratio of the first concentration to the second concentration is in a range of 1.0 to 2.5. In these ranges, the luminance of the third subpixel may be significantly improved at the relatively large viewing angles.

Figure 12:
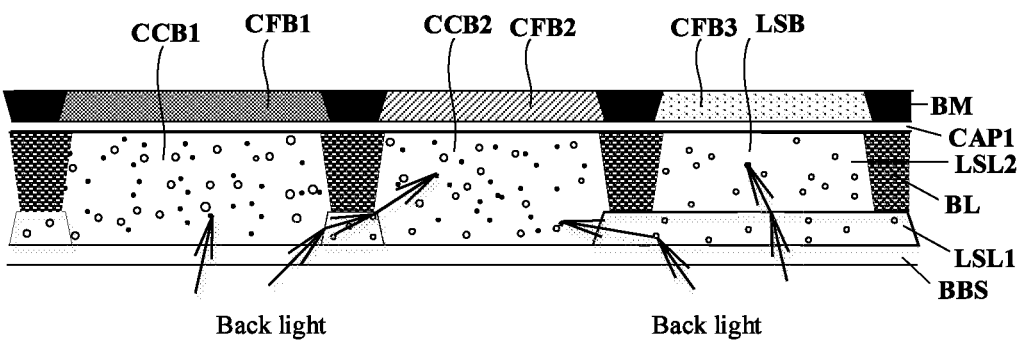
FIG. 12 illustrates a light path of light transmitting through a color conversion substrate in some embodiments according to the present disclosure.

FIG. 12 illustrates a light path of light transmitting through a color conversion substrate in some embodiments according to the present disclosure. As shown in FIG. 12, a back light (e.g., light emitted from a light emitting substrate) enters into the color conversion substrate. The first light scattering layer LSL1 may allow a portion of the back light (e.g., a blue light) to transmit between adjacent subpixels. For example, a back light entering into the first color conversion block CCB1 may be refracted by a portion of the first light scattering layer LSL1 into the second color conversion block CCB2. In another example, a back light entering into a portion of the first light scattering layer LSL1 underneath a respective light scattering block of the plurality of light scattering blocks may be refracted by a portion of the first light scattering layer LSL1 into the second color conversion block CCB2. This results in cross-talk between adjacent subpixels.

Figure 13A:
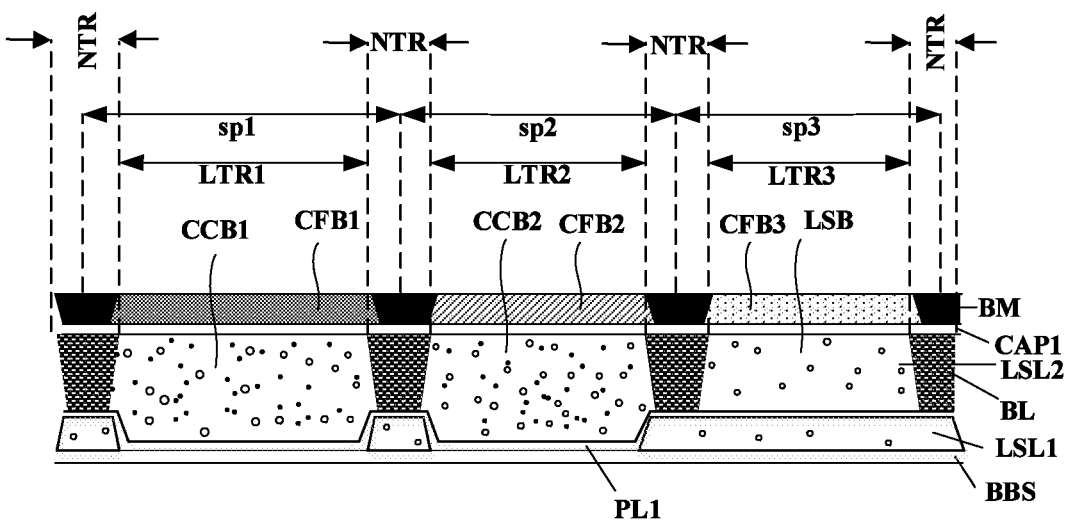
FIG. 13A is a schematic diagram illustrating the structure of a color conversion substrate in some embodiments according to the present disclosure.

FIG. 13A is a schematic diagram illustrating the structure of a color conversion substrate in some embodiments according to the present disclosure. Referring to FIG. 13A, the color conversion substate in some embodiments further includes a first refractive index layer PL1 configured to prevent light transmitting from one subpixel into an adjacent subpixel through the first light scatter layer LSL1. In some embodiments, the first refractive index layer PL1 is on a side of the first light scatter layer LSL1 away from the base substrate BBS and on a side of the bank layer BL closer to the base substrate BBS.

In some embodiments, a refractive index of the first refractive index layer PL1 is greater than a refractive index of the first light scattering layer LSL1. Optionally, a refractive index of the first light scattering layer LSL1 is in a range of 1.5 to 1.6. Optionally, a refractive index of the first refractive index layer PL1 is in a range of 1.5 to 2.0. In one example, the first refractive index layer PL1 has a thickness in a range of 0.5 μm to 2.0 μm. Various appropriate materials may be used for making the first refractive index layer PL1. Examples of appropriate insulating materials for making the first refractive index layer PL1 include silicon oxide (SiO$_x$), silicon nitride (SiN$_x$), silicon oxynitride (SiO$_x$N$_y$), aluminum oxide, barium oxide, and calcium oxide.

Figure 13B:
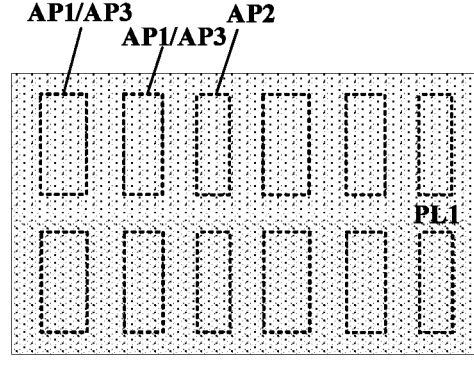
FIG. 13B is a plan view of a first refractive index layer, a plurality of first apertures, a plurality of second apertures, and a plurality of third apertures in some embodiments according to the present disclosure.
Figure 13C:
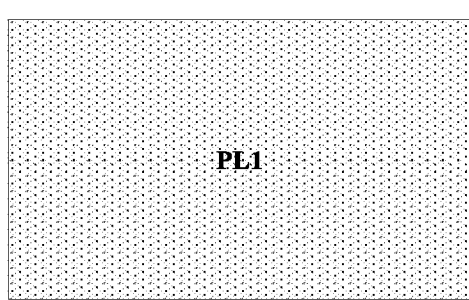
FIG. 13C is a plan view of a first refractive index layer in some embodiments according to the present disclosure.
Figure 13D:
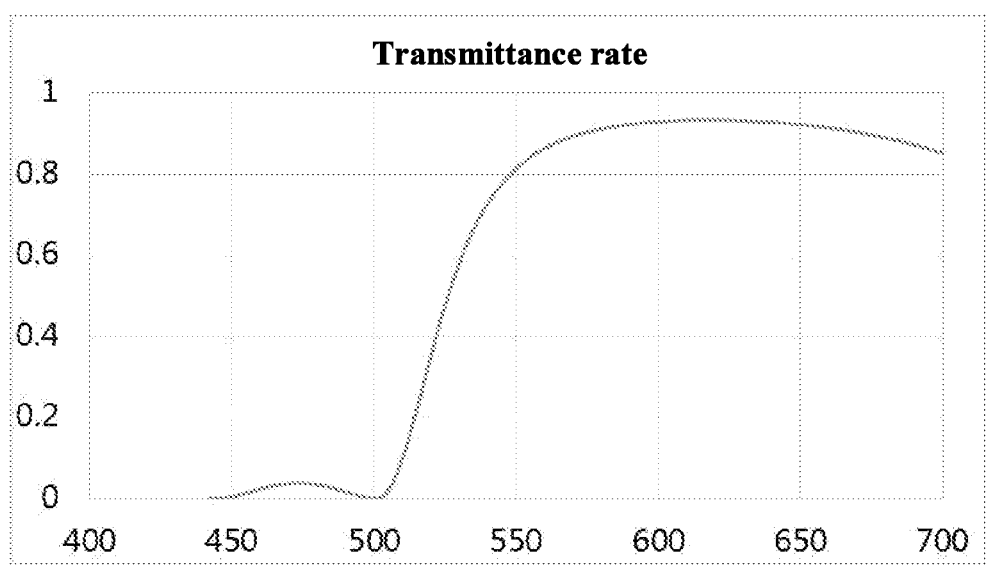
FIG. 13D shows a correlation between a transmittance rate and wavelength of incident light through a structure comprising a first light scattering layer and a first refractive index layer in some embodiments according to the present disclosure.

FIG. 13D shows a correlation between a transmittance rate and wavelength of incident light through a structure comprising a first light scattering layer and a first refractive index layer in some embodiments according to the present disclosure. Referring to FIG. 13D, the structure comprising a first light scattering layer and a first refractive index layer has a transmittance rate of less than 3% for light of wavelength in a range of 400 nm to 500 nm (blue light). The structure can effectively prevent cross-talk between adjacent subpixels.

FIG. 13B is a plan view of a first refractive index layer, a plurality of first apertures, a plurality of second apertures, and a plurality of third apertures in some embodiments according to the present disclosure. FIG. 13C is a plan view of a first refractive index layer in some embodiments according to the present disclosure. Referring to FIG. 13A to FIG. 13C, the first refractive index layer PL1 extends throughout areas corresponding to the plurality of first apertures AP1, the plurality of second apertures AP2, and/or the plurality of third apertures AP3. Optionally, an orthographic projection of the first refractive index layer PL1 on the base substrate BBS at least partially overlaps with orthographic projections of the plurality of first apertures AP1 on the base substrate BBS, and at least partially overlaps with orthographic projections of the plurality of second apertures AP2 on the base substrate BBS. Optionally, the orthographic projection of the first refractive index layer PL1 on the base substrate BBS at least partially overlaps with orthographic projections of the plurality of third apertures AP3 on the base substrate BBS.

In some embodiments, the color conversion layer CCL includes a plurality of color conversion blocks (e.g., a first color conversion block CCB1 and a second color conversion block CCB2). Optionally, the second light scattering layer LSL2 includes a plurality of light scattering blocks LSB. Optionally, an orthographic projection of the first refractive index layer PL1 on the base substrate BBS at least partially overlaps with orthographic projections of the plurality of color conversion blocks on the base substrate BBS, and at least partially overlaps with orthographic projections of the plurality of light scattering blocks LSB on the base substrate BBS. Optionally, the orthographic projection of the first refractive index layer PL1 on the base substrate BBS at least partially overlaps with an orthographic projection of the first color conversion block CCB1 on the base substrate BBS, and at least partially overlaps with an orthographic projection of the second color conversion block CCB2 on the base substrate BBS.

In some embodiments, an orthographic projection of the first refractive index layer PL1 on the base substrate BBS at least partially overlaps with an orthographic projection of the bank layer BL on the base substrate BBS.

In some embodiments, the color filter CF includes a plurality of color filter blocks (e.g., a color filter block of a first color CFB1, a color filter block of a second color CFB2, and a color filter block of a third color CFB3). Optionally, an orthographic projection of the first refractive index layer PL1 on the base substrate BBS at least partially overlaps with orthographic projections of the plurality of color filter blocks on the base substrate BBS. Optionally, the orthographic projection of the first refractive index layer PL1 on the base substrate BBS at least partially overlaps with an orthographic projection of the color filter block of a first color CFB1 on the base substrate BBS, at least partially overlaps with an orthographic projection of the color filter block of a second color CFB2 on the base substrate BBS, and at least partially overlaps with an orthographic projection of the color filter block of a third color CFB3 on the base substrate BBS.

In some embodiments, referring to FIG. 13A, the color conversion substrate comprises a first subpixel sp1, a second subpixel sp2, and a third subpixel sp3. As shown in FIG. 13A, the color conversion substrate has a first light transmissive region LTR1 in the first subpixel sp1, a second light transmissive region LTR2 in the second subpixel sp2, a third light transmissive region LTR3 in the third subpixel sp3, and a light non-transmissive region NTR. In some embodiments, the first light scattering layer LSL1 is at least partially in the third light transmissive region LTR3. The second light scattering layer LSL2 is in the third light transmissive region LTR3, e.g., is limited in the third light transmissive region LTR3. The first refractive index layer PL1 is at least partially in the third light transmissive region LTR3. Optionally, in the third light transmissive region LTR3, the first light scattering layer LSL1 and the second light scattering layer LSL2 are parts of a stacked structure. Optionally, in the third light transmissive region LTR3, the first light scattering layer LSL1, the first refractive index layer PL1, and the second light scattering layer LSL2 are parts of a stacked structure. In one example, in the third light transmissive region LTR3, the first light scattering layer LSL1 is in direct contact with the first refractive index layer PL1, and the second light scattering layer LSL2 is in direct contact with the first refractive index layer PL1. In the example depicted in FIG. 13A, the first light scattering layer LSL1 is in the third light transmissive region LTR3 and the light non-transmissive region NTR, and is absent in the first light transmissive region LTR1 and the second light transmissive region LTR2. In the example depicted in FIG. 13A, the first refractive index layer PL1 is at least partially in the first light transmissive region LTR1, at least partially in the second light transmissive region LTR2, at least partially in the third light transmissive region LTR3, and at least partially in the light non-transmissive region NTR.

Figure 14A:
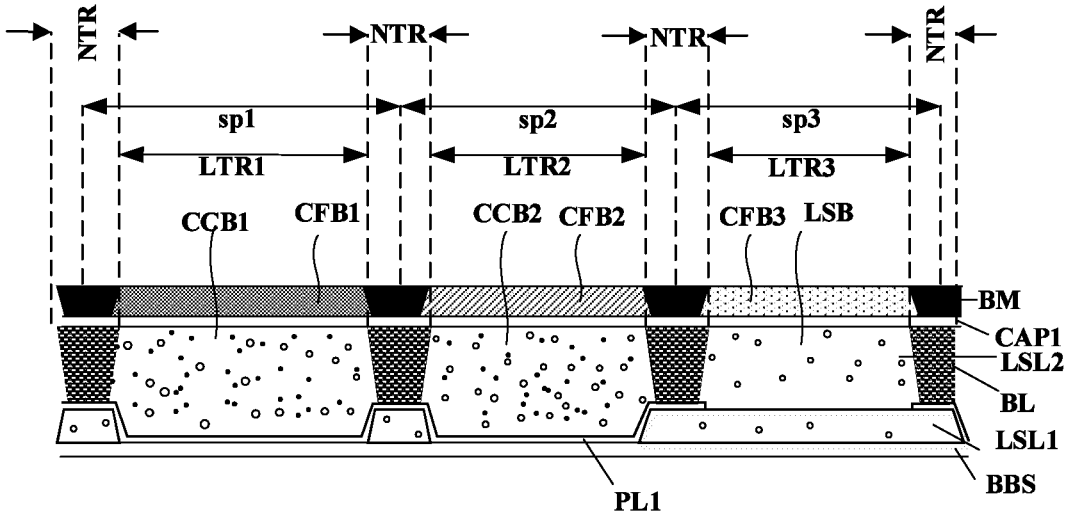
FIG. 14A is a schematic diagram illustrating the structure of a color conversion substrate in some embodiments according to the present disclosure.
Figure 14B:
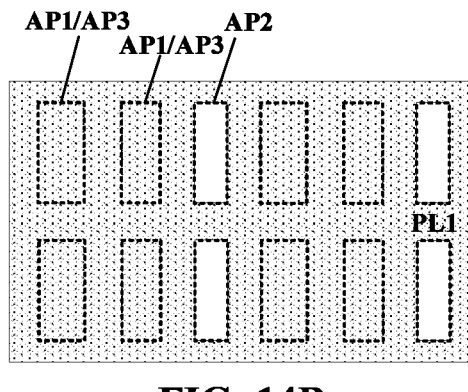
FIG. 14B is a plan view of a first refractive index layer, a plurality of first apertures, a plurality of second apertures, and a plurality of third apertures in some embodiments according to the present disclosure.
Figure 14C:
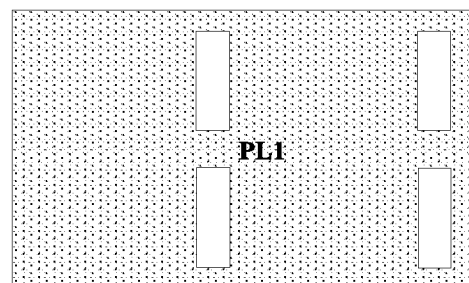
FIG. 14C is a plan view of a first refractive index layer in some embodiments according to the present disclosure.

FIG. 14A is a schematic diagram illustrating the structure of a color conversion substrate in some embodiments according to the present disclosure. FIG. 14B is a plan view of a first refractive index layer, a plurality of first apertures, a plurality of second apertures, and a plurality of third apertures in some embodiments according to the present disclosure. FIG. 14C is a plan view of a first refractive index layer in some embodiments according to the present disclosure. In the color conversion substrate depicted in FIG. 14A to FIG. 14C, the first refractive index layer PL1 extends throughout areas corresponding to the plurality of first apertures AP1, but is at least partially absent in areas corresponding to the plurality of second apertures AP2. Optionally, the first refractive index layer PL1 extends throughout areas corresponding to the plurality of third apertures AP3. Optionally, an orthographic projection of the first refractive index layer PL1 on the base substrate BBS at least partially overlaps with orthographic projections of the plurality of first apertures AP1 on the base substrate BBS, and is at least partially non-overlapping with orthographic projections of the plurality of second apertures AP2 on the base substrate BBS. Optionally, an orthographic projection of the first refractive index layer PL1 on the base substrate BBS at least partially overlaps with orthographic projections of the plurality of third apertures AP3 on the base substrate BBS. Optionally, the orthographic projection of the first refractive index layer PL1 on the base substrate BBS covers orthographic projections of the plurality of first apertures AP1 on the base substrate BBS. Optionally, the orthographic projection of the first refractive index layer PL1 on the base substrate BBS covers orthographic projections of the plurality of third apertures AP3 on the base substrate BBS.

In some embodiments, the color conversion layer CCL includes a plurality of color conversion blocks (e.g., a first color conversion block CCB1 and a second color conversion block CCB2). Optionally, the second light scattering layer LSL2 includes a plurality of light scattering blocks LSB. Optionally, an orthographic projection of the first refractive index layer PL1 on the base substrate BBS is at least partially non-overlapping with orthographic projections of the plurality of light scattering blocks LSB on the base substrate BBS, and at least partially overlaps with orthographic projections of the plurality of color conversion blocks on the base substrate BBS. Optionally, the orthographic projection of the first refractive index layer PL1 on the base substrate BBS covers an orthographic projection of the first color conversion block CCB1 on the base substrate BBS, and covers an orthographic projection of the second color conversion block CCB2 on the base substrate BBS.

In some embodiments, an orthographic projection of the first refractive index layer PL1 on the base substrate BBS at least partially overlaps with an orthographic projection of the bank layer BL on the base substrate BBS.

In some embodiments, the color filter CF includes a plurality of color filter blocks (e.g., a color filter block of a first color CFB1, a color filter block of a second color CFB2, and a color filter block of a third color CFB3). Optionally, an orthographic projection of the first refractive index layer PL1 on the base substrate BBS at least partially overlaps with an orthographic projection of the color filter block of a first color CFB1 on the base substrate BBS, at least partially overlaps with an orthographic projection of the color filter block of a second color CFB2 on the base substrate BBS, and is at least partially non-overlapping with an orthographic projection of the color filter block of a third color CFB3 on the base substrate BBS. Optionally, the orthographic projection of the first refractive index layer PL1 on the base substrate BBS covers the orthographic projection of the color filter block of a first color CFB1 on the base substrate BBS, and covers the orthographic projection of the color filter block of a second color CFB2 on the base substrate BBS.

The inventors of the present disclosure discover that, by having the first refractive index layer PL1 at least partially absent in areas corresponding to the plurality of second apertures AP2, the absorption of the back light (e.g., a blue light) in a subpixel corresponding to a respective second aperture of the plurality of second apertures AP2 (e.g., sp3 in FIG. 11B) can be effective reduced, enhancing light emission efficiency in the subpixel.

In some embodiments, referring to FIG. 14A, the color conversion substrate comprises a first subpixel sp1, a second subpixel sp2, and a third subpixel sp3. As shown in FIG. 14A, the color conversion substrate has a first light transmissive region LTR1 in the first subpixel sp1, a second light transmissive region LTR2 in the second subpixel sp2, a third light transmissive region LTR3 in the third subpixel sp3, and a light non-transmissive region NTR. In some embodiments, the first light scattering layer LSL1 is at least partially in the third light transmissive region LTR3. The second light scattering layer LSL2 is in the third light transmissive region LTR3, e.g., is limited in the third light transmissive region LTR3. The first refractive index layer PL1 is at least partially in the first light transmissive region LTR1, at least partially in the second light transmissive region LTR2, and is at least partially absent in the third light transmissive region LTR3. Optionally, in the third light transmissive region LTR3, the first light scattering layer LSL1 and the second light scattering layer LSL2 are parts of a stacked structure. In one example, in the third light transmissive region LTR3, the first light scattering layer LSL1 is in direct contact with the second light scattering layer LSL2. In the example depicted in FIG. 14A, the first light scattering layer LSL1 is in the third light transmissive region LTR3 and the light non-transmissive region NTR, and is absent in the first light transmissive region LTR1 and the second light transmissive region LTR2. In the example depicted in FIG. 14A, the first refractive index layer PL1 is at least partially in the first light transmissive region LTR1, at least partially in the second light transmissive region LTR2, at least partially in the light non-transmissive region NTR. In the example depicted in FIG. 14A, the first refractive index layer PL1 is at least partially absent (e.g., at least 50% absent, at least 60% absent, at least 70% absent, at least 80% absent, at least 90% absent, at least 95% absent, or 100% absent) in the third light transmissive region LTR3.

Figure 15A:
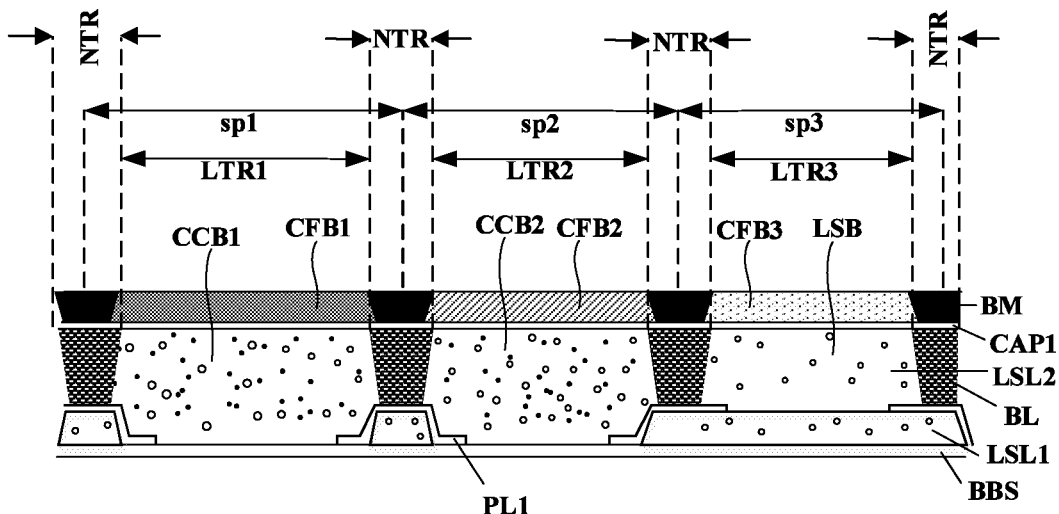
FIG. 15A is a schematic diagram illustrating the structure of a color conversion substrate in some embodiments according to the present disclosure.
Figure 15B:
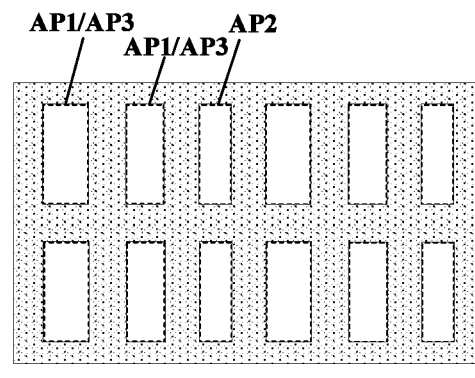
FIG. 15B is a plan view of a first refractive index layer, a plurality of first apertures, a plurality of second apertures, and a plurality of third apertures in some embodiments according to the present disclosure.
Figure 15C:
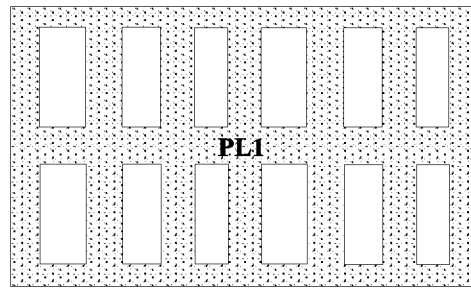
FIG. 15C is a plan view of a first refractive index layer in some embodiments according to the present disclosure.

FIG. 15A is a schematic diagram illustrating the structure of a color conversion substrate in some embodiments according to the present disclosure. FIG. 15B is a plan view of a first refractive index layer, a plurality of first apertures, a plurality of second apertures, and a plurality of third apertures in some embodiments according to the present disclosure. FIG. 15C is a plan view of a first refractive index layer in some embodiments according to the present disclosure. In the color conversion substrate depicted in FIG. 15A to FIG. 15C, the first refractive index layer PL1 is at least partially absent in areas corresponding to the plurality of first apertures AP1, and is at least partially absent in areas corresponding to the plurality of second apertures AP2. Optionally, the first refractive index layer PL1 is at least partially absent in areas corresponding to the plurality of third apertures AP3. Optionally, an orthographic projection of the first refractive index layer PL1 on the base substrate BBS is at least partially non-overlapping with orthographic projections of the plurality of first apertures AP1 on the base substrate BBS, and is at least partially non-overlapping with orthographic projections of the plurality of second apertures AP2 on the base substrate BBS. Optionally, an orthographic projection of the first refractive index layer PL1 on the base substrate BBS is at least partially non-overlapping with orthographic projections of the plurality of third apertures AP3 on the base substrate BBS.

In some embodiments, the color conversion layer CCL includes a plurality of color conversion blocks (e.g., a first color conversion block CCB1 and a second color conversion block CCB2). Optionally, the second light scattering layer LSL2 includes a plurality of light scattering blocks LSB. Optionally, an orthographic projection of the first refractive index layer PL1 on the base substrate BBS is at least partially non-overlapping with orthographic projections of the plurality of light scattering blocks LSB on the base substrate BBS, and is at least partially non-overlapping with orthographic projections of the plurality of color conversion blocks on the base substrate BBS. Optionally, the orthographic projection of the first refractive index layer PL1 on the base substrate BBS is at least partially non-overlapping with an orthographic projection of the first color conversion block CCB1 on the base substrate BBS, and is at least partially non-overlapping with an orthographic projection of the second color conversion block CCB2 on the base substrate BBS.

In some embodiments, an orthographic projection of the first refractive index layer PL1 on the base substrate BBS at least partially overlaps with an orthographic projection of the bank layer BL on the base substrate BBS.

In some embodiments, the color filter CF includes a plurality of color filter blocks (e.g., a color filter block of a first color CFB1, a color filter block of a second color CFB2, and a color filter block of a third color CFB3). Optionally, an orthographic projection of the first refractive index layer PL1 on the base substrate BBS is at least partially non-overlapping with an orthographic projection of the color filter block of a first color CFB1 on the base substrate BBS, is at least partially non-overlapping with an orthographic projection of the color filter block of a second color CFB2 on the base substrate BBS, and is at least partially non-overlapping with an orthographic projection of the color filter block of a third color CFB3 on the base substrate BBS.

The inventors of the present disclosure discover that, by having the first refractive index layer PL1 at least partially absent in areas corresponding to the plurality of first apertures AP1 and the plurality of second apertures AP2, the plurality of color conversion blocks (e.g., the first color conversion block CCB1 and the second color conversion block CCB2) can be made with an enhanced thickness, further enhancing light emission efficiency in these subpixels.

Referring to FIG. 13A to FIG. 13C, FIG. 14A to FIG. 14C, and FIG. 15A to FIG. 15C, in some embodiments, an orthographic projection of the first refractive index layer PL1 on the base substrate BBS covers an orthographic projection of the bank layer BL on the base substrate BBS.

In some embodiments, referring to FIG. 15A, the color conversion substrate comprises a first subpixel sp1, a second subpixel sp2, and a third subpixel sp3. As shown in FIG. 15A, the color conversion substrate has a first light transmissive region LTR1 in the first subpixel sp1, a second light transmissive region LTR2 in the second subpixel sp2, a third light transmissive region LTR3 in the third subpixel sp3, and a light non-transmissive region NTR. In some embodiments, the first light scattering layer LSL1 is at least partially in the third light transmissive region LTR3. The second light scattering layer LSL2 is in the third light transmissive region LTR3, e.g., is limited in the third light transmissive region LTR3. The first refractive index layer PL1 is at least partially absent in the first light transmissive region LTR1, at least partially absent in the second light transmissive region LTR2, and is at least partially absent in the third light transmissive region LTR3, and is at least partially in the light non-transmissive region NTR. Optionally, in the third light transmissive region LTR3, the first light scattering layer LSL1 and the second light scattering layer LSL2 are parts of a stacked structure. In one example, in the third light transmissive region LTR3, the first light scattering layer LSL1 is in direct contact with the second light scattering layer LSL2. In the example depicted in FIG. 15A, the first light scattering layer LSL1 is in the third light transmissive region LTR3 and the light non-transmissive region NTR, and is absent in the first light transmissive region LTR1 and the second light transmissive region LTR2. In the example depicted in FIG. 15A, the first refractive index layer PL1 is at least partially absent (e.g., at least 50% absent, at least 60% absent, at least 70% absent, at least 80% absent, at least 90% absent, at least 95% absent, or 100% absent) in the first light transmissive region LTR1, at least partially absent (e.g., at least 50% absent, at least 60% absent, at least 70% absent, at least 80% absent, at least 90% absent, at least 95% absent, or 100% absent) in the second light transmissive region LTR2, and is at least partially absent (e.g., at least 50% absent, at least 60% absent, at least 70% absent, at least 80% absent, at least 90% absent, at least 95% absent, or 100% absent) in the third light transmissive region LTR3, and is at least partially in the light non-transmissive region NTR. In the example depicted in FIG. 15A, the first refractive index layer PL1 is at least partially present (e.g., at least 50% present, at least 60% present, at least 70% present, at least 80% present, at least 90% present, at least 95% present, or 100% present) in the light non-transmissive region NTR.

Figure 16A:
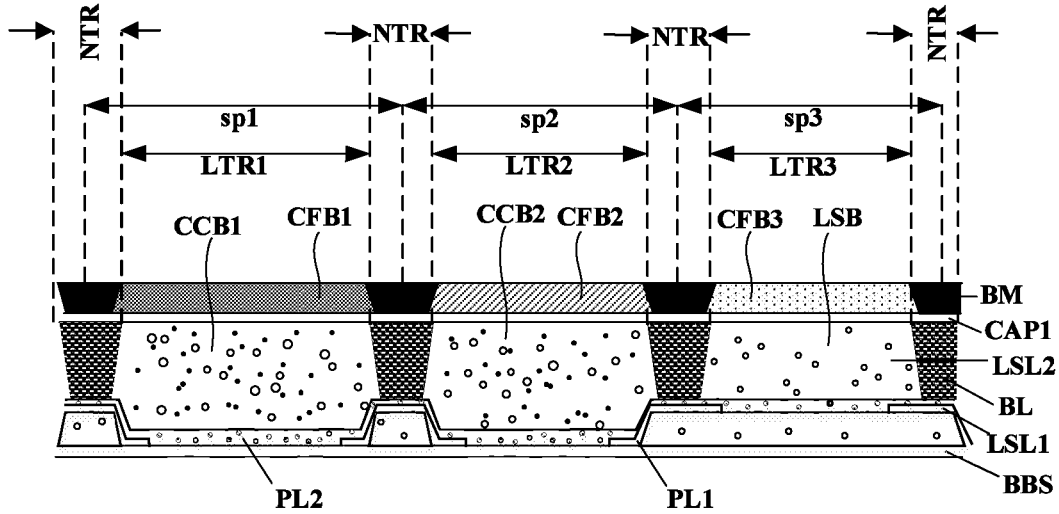
FIG. 16A is a schematic diagram illustrating the structure of a color conversion substrate in some embodiments according to the present disclosure.
Figure 16B:
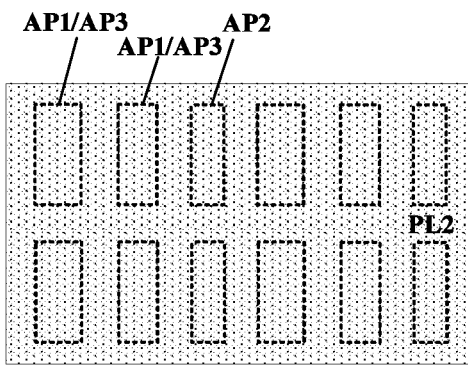
FIG. 16B is a plan view of a second refractive index layer, a plurality of first apertures, a plurality of second apertures, and a plurality of third apertures in some embodiments according to the present disclosure.
Figure 16C:
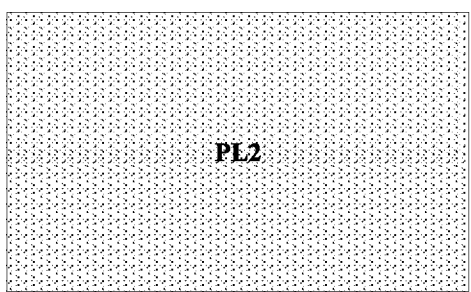
FIG. 16C is a plan view of a second refractive index layer in some embodiments according to the present disclosure.

FIG. 16A is a schematic diagram illustrating the structure of a color conversion substrate in some embodiments according to the present disclosure. FIG. 16B is a plan view of a second refractive index layer, a plurality of first apertures, a plurality of second apertures, and a plurality of third apertures in some embodiments according to the present disclosure. FIG. 16C is a plan view of a second refractive index layer in some embodiments according to the present disclosure. Referring to FIG. 16A to FIG. 16C, the color conversion substrate in some embodiments further includes a second refractive index layer PL2 on a side of the first refractive index layer PL1 away from the base substrate BBS and on a side of the bank layer BL closer to the base substrate BBS.

In some embodiments, a refractive index of the first refractive index layer PL1 is greater than a refractive index of the second refractive index layer PL2. Optionally, a refractive index of the first refractive index layer PL1 is in a range of 1.5 to 2.0. Optionally, a refractive index of the second refractive index layer is in a range of 1.25 to 1.45. In one example, the second refractive index layer PL2 has a thickness in a range of 0.2 μm to 1.0 μm.

Various appropriate materials may be used for making the second refractive index layer PL2. In some embodiments, the second refractive index layer PL2 includes a polymer matrix and hollow particles distributed in the polymer matrix. The hollow particles may be made of a material such as silicon oxide ($SiO_x$), aluminum oxide, and calcium oxide.

The inventors of the present disclosure discover that, by having the second refractive index layer PL2, the light emission efficiency of the color conversion substrate can be further improved.

In some embodiments, referring to FIG. 16A to FIG. 16C, the second refractive index layer PL2 extends throughout areas corresponding to the plurality of first apertures AP1, the plurality of second apertures AP2, and/or the plurality of third apertures AP3. Optionally, an orthographic projection of the second refractive index layer PL2 on the base substrate BBS at least partially overlaps with orthographic projections of the plurality of first apertures AP1 on the base substrate BBS, and at least partially overlaps with orthographic projections of the plurality of second apertures AP2 on the base substrate BBS. Optionally, the orthographic projection of the second refractive index layer PL2 on the base substrate BBS at least partially overlaps with orthographic projections of the plurality of third apertures AP3 on the base substrate BBS.

In some embodiments, the color conversion layer CCL includes a plurality of color conversion blocks (e.g., a first color conversion block CCB1 and a second color conversion block CCB2). Optionally, the second light scattering layer LSL2 includes a plurality of light scattering blocks LSB. Optionally, an orthographic projection of the second refractive index layer PL2 on the base substrate BBS at least partially overlaps with orthographic projections of the plurality of color conversion blocks on the base substrate BBS, and at least partially overlaps with orthographic projections of the plurality of light scattering blocks LSB on the base substrate BBS. Optionally, the orthographic projection of the second refractive index layer PL2 on the base substrate BBS at least partially overlaps with an orthographic projection of the first color conversion block CCB1 on the base substrate BBS, and at least partially overlaps with an orthographic projection of the second color conversion block CCB2 on the base substrate BBS.

In some embodiments, an orthographic projection of the second refractive index layer PL2 on the base substrate BBS at least partially overlaps with an orthographic projection of the bank layer BL on the base substrate BBS.

In some embodiments, the color filter CF includes a plurality of color filter blocks (e.g., a color filter block of a first color CFB1, a color filter block of a second color CFB2, and a color filter block of a third color CFB3). Optionally, an orthographic projection of the second refractive index layer PL2 on the base substrate BBS at least partially overlaps with orthographic projections of the plurality of color filter blocks on the base substrate BBS. Optionally, the orthographic projection of the second refractive index layer PL2 on the base substrate BBS at least partially overlaps with an orthographic projection of the color filter block of a first color CFB1 on the base substrate BBS, at least partially overlaps with an orthographic projection of the color filter block of a second color CFB2 on the base substrate BBS, and at least partially overlaps with an orthographic projection of the color filter block of a third color CFB3 on the base substrate BBS.

In some embodiments, referring to FIG. 16A, the color conversion substrate comprises a first subpixel sp1, a second subpixel sp2, and a third subpixel sp3. As shown in FIG. 16A, the color conversion substrate has a first light transmissive region LTR1 in the first subpixel sp1, a second light transmissive region LTR2 in the second subpixel sp2, a third light transmissive region LTR3 in the third subpixel sp3, and a light non-transmissive region NTR. In some embodiments, the first light scattering layer LSL1 is at least partially in the third light transmissive region LTR3. The second light scattering layer LSL2 is in the third light transmissive region LTR3, e.g., is limited in the third light transmissive region LTR3. The first refractive index layer PL1 is at least partially absent in the first light transmissive region LTR1, at least partially absent in the second light transmissive region LTR2, is at least partially absent in the third light transmissive region LTR3, and is at least partially in the light non-transmissive region NTR. The second refractive index layer PL2 is at least partially in the first light transmissive region LTR1, at least partially in the second light transmissive region LTR2, at least partially in the third light transmissive region LTR3, and at least partially in the light non-transmissive region NTR. Optionally, in the third light transmissive region LTR3, the first light scattering layer LSL1, the second refractive index layer PL2, and the second light scattering layer LSL2 are parts of a stacked structure. In one example, in the third light transmissive region LTR3, the first light scattering layer LSL1 is in direct contact with the second refractive index layer PL2; and the second light scattering layer LSL2 is in direct contact with the second refractive index layer PL2. In the example depicted in FIG. 16A, the first light scattering layer LSL1 is in the third light transmissive region LTR3 and the light non-transmissive region NTR, and is absent in the first light transmissive region LTR1 and the second light transmissive region LTR2.

In the example depicted in FIG. 16A, the first refractive index layer PL1 is at least partially absent (e.g., at least 50% absent, at least 60% absent, at least 70% absent, at least 80% absent, at least 90% absent, at least 95% absent, or 100% absent) in the first light transmissive region LTR1, at least partially absent (e.g., at least 50% absent, at least 60% absent, at least 70% absent, at least 80% absent, at least 90% absent, at least 95% absent, or 100% absent) in the second light transmissive region LTR2, and is at least partially absent (e.g., at least 50% absent, at least 60% absent, at least 70% absent, at least 80% absent, at least 90% absent, at least 95% absent, or 100% absent) in the third light transmissive region LTR3, and is at least partially in the light non-transmissive region NTR. In the example depicted in FIG. 16A, the first refractive index layer PL1 is at least partially present (e.g., at least 50% present, at least 60% present, at least 70% present, at least 80% present, at least 90% present, at least 95% present, or 100% present) in the light non-transmissive region NTR.

Figure 17A:
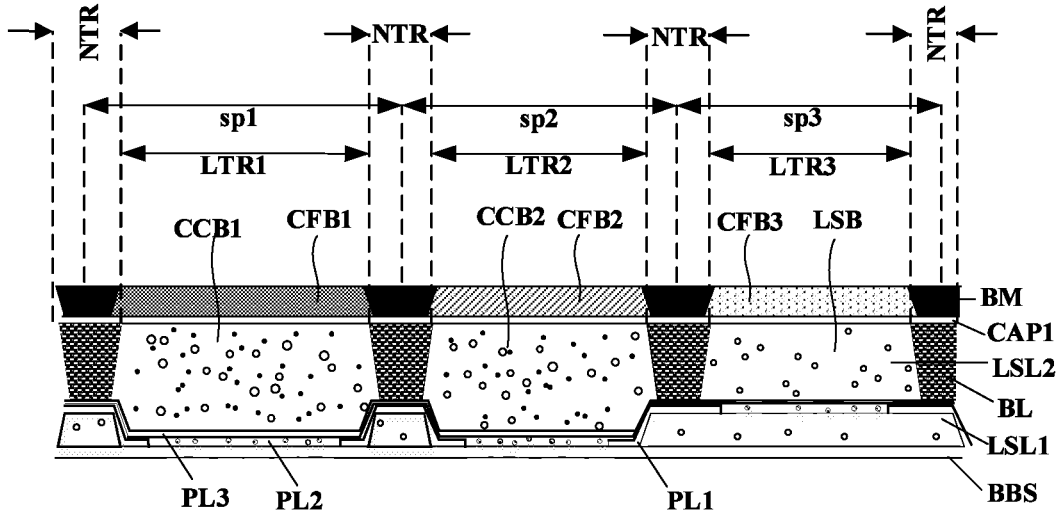
FIG. 17A is a schematic diagram illustrating the structure of a color conversion substrate in some embodiments according to the present disclosure.
Figure 17B:
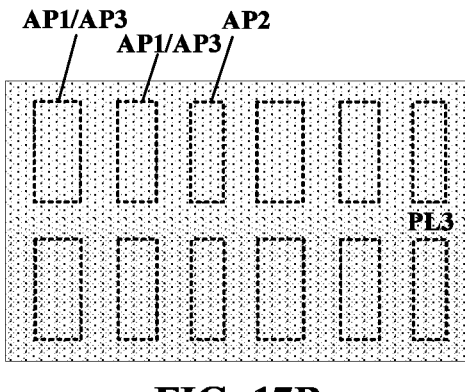
FIG. 17B is a plan view of a third refractive index layer, a plurality of first apertures, a plurality of second apertures, and a plurality of third apertures in some embodiments according to the present disclosure.
Figure 17C:
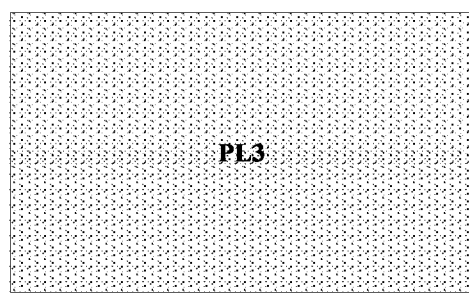
FIG. 17C is a plan view of a third refractive index layer in some embodiments according to the present disclosure.

FIG. 17A is a schematic diagram illustrating the structure of a color conversion substrate in some embodiments according to the present disclosure. FIG. 17B is a plan view of a third refractive index layer, a plurality of first apertures, a plurality of second apertures, and a plurality of third apertures in some embodiments according to the present disclosure. FIG. 17C is a plan view of a third refractive index layer in some embodiments according to the present disclosure. Referring to FIG. 17A to FIG. 17C, the color conversion substrate in some embodiments further includes a third refractive index layer PL3 on a side of the second refractive index layer PL2 away from the base substrate BBS and on a side of the bank layer BL closer to the base substrate BBS.

In some embodiments, a refractive index of the third refractive index layer PL3 is greater than a refractive index of the second refractive index layer PL2. Optionally, the refractive index of the third refractive index layer is in a range of 1.4 to 1.6. Optionally, the refractive index of the third refractive index layer PL3 is in a range of 1.4 to 1.6; and the refractive index of the second refractive index layer PL2 is in a range of 1.30 to 1.45. In one example, the third refractive index layer PL3 has a thickness in a range of 0.5 μm to 1.0 μm; and the second refractive index layer PL2 has a thickness in a range of 0.2 μm to 0.5 μm.

In some embodiments, a refractive index of the first refractive index layer PL1 is greater than a refractive index of the first light scattering layer LSL1; the refractive index of the first refractive index layer PL1 is greater than a refractive index of the second refractive index layer PL2; and a refractive index of the third refractive index layer PL3 is greater than the refractive index of the second refractive index layer PL2. In one example, the refractive index of the third refractive index layer is in a range of 1.4 to 1.6; the refractive index of the second refractive index layer is in a range of 1.25 to 1.45; a refractive index of the first refractive index layer is in a range of 1.5 to 2.0; and a refractive index of the first light scattering layer is in a range of 1.5 to 1.6.

Various appropriate materials may be used for making the third refractive index layer PL3. Examples of appropriate insulating materials for making the third refractive index layer PL3 include acrylic resins, polyurethane resins, silicone resins, and epoxy resins.

The inventors of the present disclosure discover that, by having the third refractive index layer PL3, the light emission efficiency of the color conversion substrate can be further improved.

In some embodiments, referring to FIG. 17A to FIG. 17C, the third refractive index layer PL3 extends throughout areas corresponding to the plurality of first apertures AP1, the plurality of second apertures AP2, and/or the plurality of third apertures AP3. Optionally, an orthographic projection of the third refractive index layer PL3 on the base substrate BBS at least partially overlaps with orthographic projections of the plurality of first apertures AP1 on the base substrate BBS, and at least partially overlaps with orthographic projections of the plurality of second apertures AP2 on the base substrate BBS. Optionally, the orthographic projection of the third refractive index layer PL3 on the base substrate BBS at least partially overlaps with orthographic projections of the plurality of third apertures AP3 on the base substrate BBS.

In some embodiments, the color conversion layer CCL includes a plurality of color conversion blocks (e.g., a first color conversion block CCB1 and a second color conversion block CCB2). Optionally, the second light scattering layer LSL2 includes a plurality of light scattering blocks LSB. Optionally, an orthographic projection of the third refractive index layer PL3 on the base substrate BBS at least partially overlaps with orthographic projections of the plurality of color conversion blocks on the base substrate BBS, and at least partially overlaps with orthographic projections of the plurality of light scattering blocks LSB on the base substrate BBS. Optionally, the orthographic projection of the third refractive index layer PL3 on the base substrate BBS at least partially overlaps with an orthographic projection of the first color conversion block CCB1 on the base substrate BBS, and at least partially overlaps with an orthographic projection of the second color conversion block CCB2 on the base substrate BBS.

In some embodiments, an orthographic projection of the third refractive index layer PL3 on the base substrate BBS at least partially overlaps with an orthographic projection of the bank layer BL on the base substrate BBS.

In some embodiments, the color filter CF includes a plurality of color filter blocks (e.g., a color filter block of a first color CFB1, a color filter block of a second color CFB2, and a color filter block of a third color CFB3). Optionally, an orthographic projection of the third refractive index layer PL3 on the base substrate BBS at least partially overlaps with orthographic projections of the plurality of color filter blocks on the base substrate BBS. Optionally, the orthographic projection of the third refractive index layer PL3 on the base substrate BBS at least partially overlaps with an orthographic projection of the color filter block of a first color CFB1 on the base substrate BBS, at least partially overlaps with an orthographic projection of the color filter block of a second color CFB2 on the base substrate BBS, and at least partially overlaps with an orthographic projection of the color filter block of a third color CFB3 on the base substrate BBS.

In some embodiments, referring to FIG. 17A, the color conversion substrate comprises a first subpixel sp1, a second subpixel sp2, and a third subpixel sp3. As shown in FIG. 17A, the color conversion substrate has a first light transmissive region LTR1 in the first subpixel sp1, a second light transmissive region LTR2 in the second subpixel sp2, a third light transmissive region LTR3 in the third subpixel sp3, and a light non-transmissive region NTR. In some embodiments, the first light scattering layer LSL1 is at least partially in the third light transmissive region LTR3. The second light scattering layer LSL2 is in the third light transmissive region LTR3, e.g., is limited in the third light transmissive region LTR3. The first refractive index layer PL1 is at least partially absent in the first light transmissive region LTR1, at least partially absent in the second light transmissive region LTR2, is at least partially absent in the third light transmissive region LTR3, and is at least partially in the light non-transmissive region NTR. The second refractive index layer PL2 is at least partially in the first light transmissive region LTR1, at least partially in the second light transmissive region LTR2, at least partially in the third light transmissive region LTR3, and at least partially in the light non-transmissive region NTR. The third refractive index layer PL3 is at least partially in the first light transmissive region LTR1, at least partially in the second light transmissive region LTR2, at least partially in the third light transmissive region LTR3, and at least partially in the light non-transmissive region NTR. Optionally, in the third light transmissive region LTR3, the first light scattering layer LSL1, the second refractive index layer PL2, the third refractive index layer PL3, and the second light scattering layer LSL2 are parts of a stacked structure. In one example, in the third light transmissive region LTR3, the first light scattering layer LSL1 is in direct contact with the second refractive index layer PL2; the second refractive index layer PL2 is in direct contact with the third refractive index layer PL3, the third refractive index layer PL3 is in direct contact with the second light scattering layer LSL2. In the example depicted in FIG. 17A, the first light scattering layer LSL1 is in the third light transmissive region LTR3 and the light non-transmissive region NTR, and is absent in the first light transmissive region LTR1 and the second light transmissive region LTR2. In the example depicted in FIG. 17A, the first refractive index layer PL1 is at least partially absent (e.g., at least 50% absent, at least 60% absent, at least 70% absent, at least 80% absent, at least 90% absent, at least 95% absent, or 100% absent) in the first light transmissive region LTR1, at least partially absent (e.g., at least 50% absent, at least 60% absent, at least 70% absent, at least 80% absent, at least 90% absent, at least 95% absent, or 100% absent) in the second light transmissive region LTR2, and is at least partially absent (e.g., at least 50% absent, at least 60% absent, at least 70% absent, at least 80% absent, at least 90% absent, at least 95% absent, or 100% absent) in the third light transmissive region LTR3, and is at least partially in the light non-transmissive region NTR. In the example depicted in FIG. 17A, the first refractive index layer PL1 is at least partially present (e.g., at least 50% present, at least 60% present, at least 70% present, at least 80% present, at least 90% present, at least 95% present, or 100% present) in the light non-transmissive region NTR.

In another aspect, the present disclosure provides a display apparatus, including the color conversion substrate described herein or fabricated by a method described herein, and a light emitting substrate comprising a plurality of light emitting elements. Examples of appropriate display apparatuses include, but are not limited to, an electronic paper, a mobile phone, a tablet computer, a television, a monitor, a notebook computer, a digital album, a GPS, etc.

In some embodiments, a respective light emitting element of the plurality of light emitting elements is configured to provide light to a respective first aperture of the plurality of first apertures or a respective second aperture of the plurality of second apertures.

In another aspect, the present disclosure provides a method of fabricating a display panel. In some embodiments, the method includes forming a first light scattering layer on a base substrate; forming a bank layer on a base substrate; forming a plurality of first apertures and a plurality of second apertures extending through the bank layer;

forming a color conversion layer at least partially in the plurality of first apertures; and forming a second light scattering layer at least partially in the plurality of second apertures.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A color conversion substrate, comprising:
a first light scattering layer on a base substrate;
a bank layer on the base substrate;
a plurality of first apertures and a plurality of second apertures extending through the bank layer;
a color conversion layer at least partially in the plurality of first apertures; and
a second light scattering layer at least partially in the plurality of second apertures;
wherein the color conversion substrate comprises a first subpixel, a second subpixel, and a third subpixel;
the color conversion substrate has a first light transmissive region in the first subpixel, a second light transmissive region in the second subpixel, a third light transmissive region in the third subpixel, and a light non-transmissive region;
the first light scattering layer is at least partially in the third light transmissive region;
the second light scattering layer is in the third light transmissive region; and
in the third light transmissive region, the first light scattering layer and the second light scattering layer are parts of a stacked structure.

2. The color conversion substrate of claim 1, wherein the first light scattering layer is in the third light transmissive region and the light non-transmissive region, and is absent in the first light transmissive region and the second light transmissive region.

3. The color conversion substrate of claim 1, wherein a first thickness of the first light scattering layer is equal to or less than a second thickness of the second light scattering layer.

4. The color conversion substrate of claim 3, wherein a ratio of the first thickness to the second thickness is in a range of 0.2 to 1.0.

5. The color conversion substrate of claim 1, wherein the first light scattering layer comprises light scattering particles in a first concentration;

the second light scattering layer comprises light scattering particles in a second concentration; and the first concentration is equal to or greater than the second concentration.

6. The color conversion substrate of claim 5, wherein a ratio of the first concentration to the second concentration is in a range of 1.0 to 2.5.

7. The color conversion substrate of claim 1, further comprising a plurality of third apertures at least partially extending through the first light scattering layer.

8. The color conversion substrate of claim 7, wherein an orthographic projection of the first light scattering layer on the base substrate is at least partially non-overlapping with an orthographic projection of the plurality of first apertures on the base substrate.

9. The color conversion substrate of claim 7, wherein an orthographic projection of the first light scattering layer on the base substrate covers an orthographic projection of the plurality of second apertures on the base substrate.

10. The color conversion substrate of claim 7, wherein the color conversion layer comprises a plurality of color conversion blocks; and a respective color conversion block of the plurality of color conversion blocks is partially in a respective first aperture of the plurality of first apertures and partially in a respective third aperture of the plurality of third apertures.

11. The color conversion substrate of claim 1, further comprising a first refractive index layer configured to prevent light transmitting from one subpixel into an adjacent subpixel through the first light scatter layer;

wherein the first refractive index layer is on a side of the first light scatter layer away from the base substrate and on a side of the bank layer closer to the base substrate; and a refractive index of the first refractive index layer is greater than a refractive index of the first light scattering layer.

12. The color conversion substrate of claim 11, wherein an orthographic projection of the first refractive index layer on the base substrate is at least partially non-overlapping with an orthographic projection of the plurality of second apertures on the base substrate.

13. The color conversion substrate of claim 11, wherein an orthographic projection of the first refractive index layer on the base substrate is at least partially non-overlapping with an orthographic projection of the plurality of first apertures on the base substrate.

14. The color conversion substrate of claim 11, wherein an orthographic projection of the first prevention layer on the base substrate covers an orthographic projection of the bank layer on the base substrate.

15. The color conversion substrate of claim 11, further comprising a second refractive index layer on a side of the first refractive index layer away from the base substrate and on a side of the bank layer closer to the base substrate.

16. The color conversion substrate of claim 15, wherein a refractive index of the first refractive index layer is greater than a refractive index of the second refractive index layer.

17. The color conversion substrate of claim 15, wherein the second refractive index layer comprises a polymer matrix and hollow particles distributed in the polymer matrix.

18. The color conversion substrate of claim 15, further comprising a third refractive index layer on a side of the second refractive index layer away from the base substrate and on a side of the bank layer closer to the base substrate;

wherein a refractive index of the third refractive index layer is greater than a refractive index of the second refractive index layer.

19. The color conversion substrate of claim 18, wherein the refractive index of the third refractive index layer is in a range of 1.4 to 1.6;

the refractive index of the second refractive index layer is in a range of 1.25 to 1.45;

a refractive index of the first refractive index layer is in a range of 1.5 to 2.0; and a refractive index of the first light scattering layer is in a range of 1.5 to 1.6.

20. A display apparatus, comprising the color conversion substrate of claim 1, and a light emitting substrate comprising a plurality of light emitting elements;

wherein a respective light emitting element of the plurality of light emitting elements is configured to provide light to a respective first aperture of the plurality of first apertures or a respective second aperture of the plurality of second apertures.

* * * * *